US012648234B2

(12) United States Patent
Song et al.

(10) Patent No.:  US 12,648,234 B2
(45) Date of Patent:       Jun. 2, 2026

(54) SEMICONDUCTOR INTEGRATED CIRCUIT DEVICE INCLUDING AN ELECTROSTATIC DISCHARGE PROTECTION CIRCUIT

(71) Applicant: SK hynix Inc., Icheon-si (KR)

(72) Inventors: Chang Seok Song, Icheon-si (KR); Jin Woo Kim, Icheon-si (KR); Yoon Sung Lee, Icheon-si (KR); Dong Ju Lim, Icheon-si (KR)

(73) Assignee: SK hynix Inc., Icheon-si (KR)

( * ) Notice:     Subject to any disclaimer, the term of this patent is extended or adjusted under 35 U.S.C. 154(b) by 1027 days.

(21) Appl. No.: 17/685,973

(22) Filed:      Mar. 3, 2022

(65)          Prior Publication Data

US 2023/0049774 A1      Feb. 16, 2023

(30)       Foreign Application Priority Data

Aug. 11, 2021    (KR) ......................... 10-2021-0106123

(51) Int. Cl.
*H10D 89/60*           (2025.01)
(52) U.S. Cl.
CPC ......... *H10D 89/921* (2025.01); *H10D 89/611* (2025.01); *H10D 89/931* (2025.01)
(58) Field of Classification Search
CPC .. H10D 89/921; H10D 89/611; H10D 89/931; H01L 23/62
USPC ....................................................... 257/355
See application file for complete search history.

(56)            References Cited

U.S. PATENT DOCUMENTS

| | | | |
|---|---|---|---|
| 10,510,738 B2 | 12/2019 | Kim et al. | |
| 2007/0215948 A1* | 9/2007 | Yang ..................... | H10D 89/611 |
| | | | 257/734 |
| 2016/0165730 A1* | 6/2016 | Fu ....................... | H01L 25/0657 |
| | | | 361/748 |
| 2019/0379204 A1* | 12/2019 | Lee ....................... | H10D 89/811 |
| 2020/0075575 A1 | 3/2020 | Sharma | |
| 2021/0366846 A1* | 11/2021 | Hung ................... | H10D 89/711 |

FOREIGN PATENT DOCUMENTS

KR        1020140047587 A      4/2014

* cited by examiner

*Primary Examiner* — Mohammad M Hoque

(57)           ABSTRACT

A semiconductor integrated circuit device may include a first region, a second region, a pad structure and an electrostatic discharge (ESD) connection. The first region may be positioned adjacent to a semiconductor substrate. An ESD protection circuit may be integrated in the first region. The second region may be stacked on the first region. A plurality of memory cells may be formed in the second region. The pad structure may be arranged over the second region to receive an external voltage. The ESD connection may include a plurality of lower conductive wirings in the first region. At least one of the lower conductive wirings may be electrically connected with the ESD protection circuit. The at least one of the lower conductive wirings may be drawn to a portion corresponding to the pad structure.

19 Claims, 27 Drawing Sheets

PA1

205

200

PA1

220
205

200

PA1

~ 230
~ 220
~ 205

~ 200

PA1

BC2

245Px

~ 255

F

~ 250

245Py

~ 240

~ 230

~ 220

~ 205

~ 200

150a

150b

SEMICONDUCTOR INTEGRATED CIRCUIT DEVICE INCLUDING AN ELECTROSTATIC DISCHARGE PROTECTION CIRCUIT

CROSS-REFERENCES TO RELATED APPLICATION

The present application claims priority under 35 U.S.C. § 119(a) to Korean application number 10-2021-0106123, filed on Aug. 11, 2021, in the Korean Intellectual Property Office, which is incorporated herein by reference in its entirety.

BACKGROUND

1. Technical Field

Various embodiments may generally relate to a semiconductor integrated circuit device, and more particularly, to a semiconductor integrated circuit device including an electrostatic discharge protection circuit.

2. Related Art

Although the volume of electronic devices continues to gradually decrease, devices may still be required to process massive amounts of data. Thus, it may also be required to increase an integration degree of semiconductor memory devices used in electronic devices.

Recently designed semiconductor memory devices may include a cell region and a peripheral circuit region under the cell region to convert an area of the peripheral circuit region into the cell region. The peripheral circuit region under the cell region may include an electrostatic discharge (ESD) protection circuit configured to discharge a static electricity inputted from a pad as well as peripheral circuits, which are configured to control memory operations of the cell region.

A pad configured to receive an external signal and a power line configured to transmit a voltage may be positioned at an uppermost portion of the cell region. The ESD protection circuit and the pad, and the ESD protection circuit and the power line, may be electrically connected with each other through contacts in the cell region and the peripheral circuit region.

However, in a three-dimensional NAND flash device, hundreds of memory cells may be stacked so that the cell region has an undesirably high height.

As a result, the contacts in the ESD protection circuit configured to receive different voltages may also have a high height to increase a coupling capacitance of the ESD protection circuit, thereby decreasing robustness of the ESD protection circuit.

SUMMARY

In embodiments of the present disclosure, a semiconductor integrated circuit device may include a first region, a second region, a pad structure and an electrostatic discharge (ESD) connection. The first region may be positioned adjacent to a semiconductor substrate. An ESD protection circuit may be integrated in the first region. The second region may be stacked on the first region in a vertical direction. A plurality of memory cells may be disposed in the second region. The pad structure may be arranged over the second region to receive an external voltage. The ESD connection may include a plurality of lower conductive wirings in the first region. At least one of the lower conductive wirings may be electrically connected with the ESD protection circuit and to the pad structure.

In embodiments of the present disclosure, a semiconductor integrated circuit device may include a cell region and a peripheral circuit region. A plurality of memory cells and upper conductive wirings electrically connected with the memory cells may be disposed in the cell region. A pad configured to receive an external signal and at least one power line configured to receive a voltage may be arranged in an upper portion of the cell region. The peripheral circuit region may include an ESD protection circuit arranged between the cell region and a semiconductor substrate to discharge a static electricity inputted from the pad. The ESD protection circuit may include a plurality of protection device regions, at least one lower conductive wiring and an uppermost lower conductive wiring. From a plan view, the protection device region may include a frame-shaped first electrode region and a patterned second electrode region. The second electrode region may be positioned in the first electrode region. The at least one lower conductive wiring may be arranged in a shape corresponding to shapes of the first electrode region and the second electrode region. The at least one lower conductive wiring may be electrically connected to the first electrode region and the second electrode region. The uppermost lower conductive wiring may be arranged on the lower conductive wiring. The uppermost lower conductive wiring may include a first electrode correspondence corresponding to the first electrode region, a second electrode correspondence corresponding to the second electrode region, and an ESD connection arranged between the second electrode correspondence and a region corresponding to the pad.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

Figure 1:
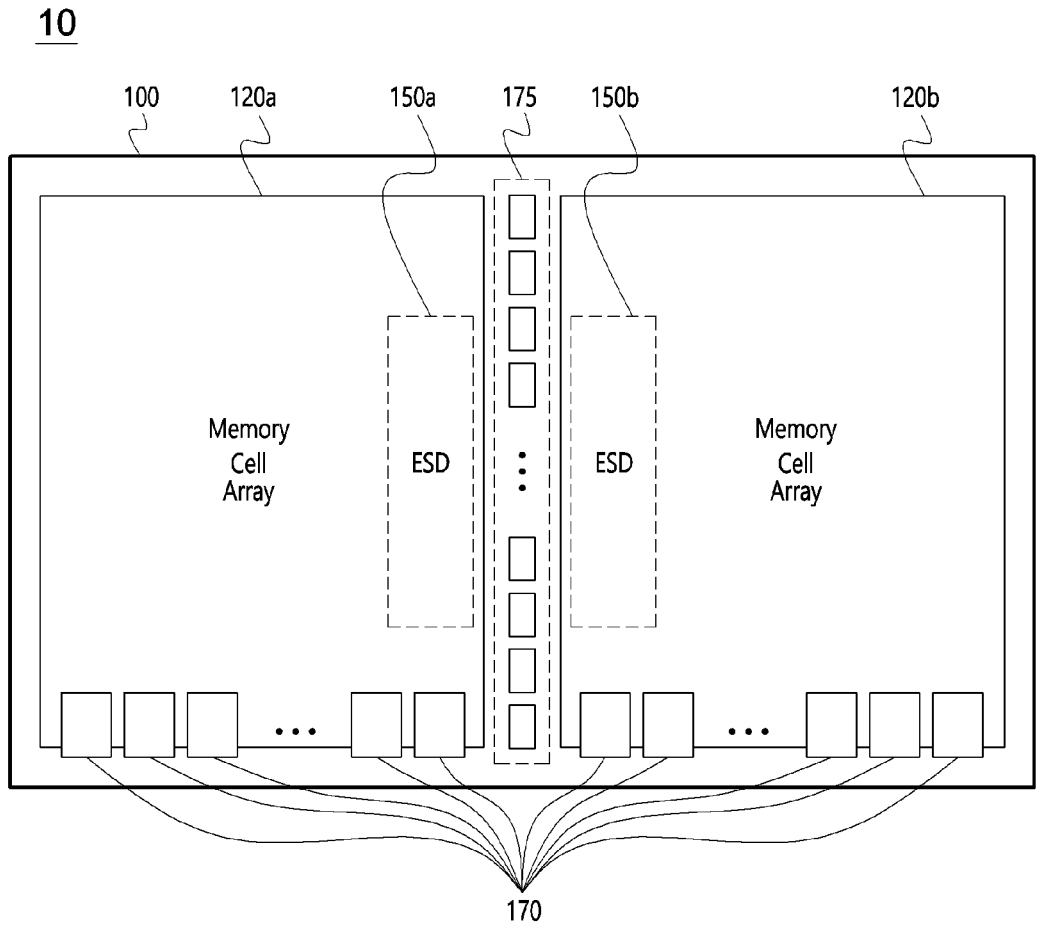
FIG. 1 is a plan view illustrating a semiconductor memory device in accordance with embodiments of the present disclosure.
Figure 2:
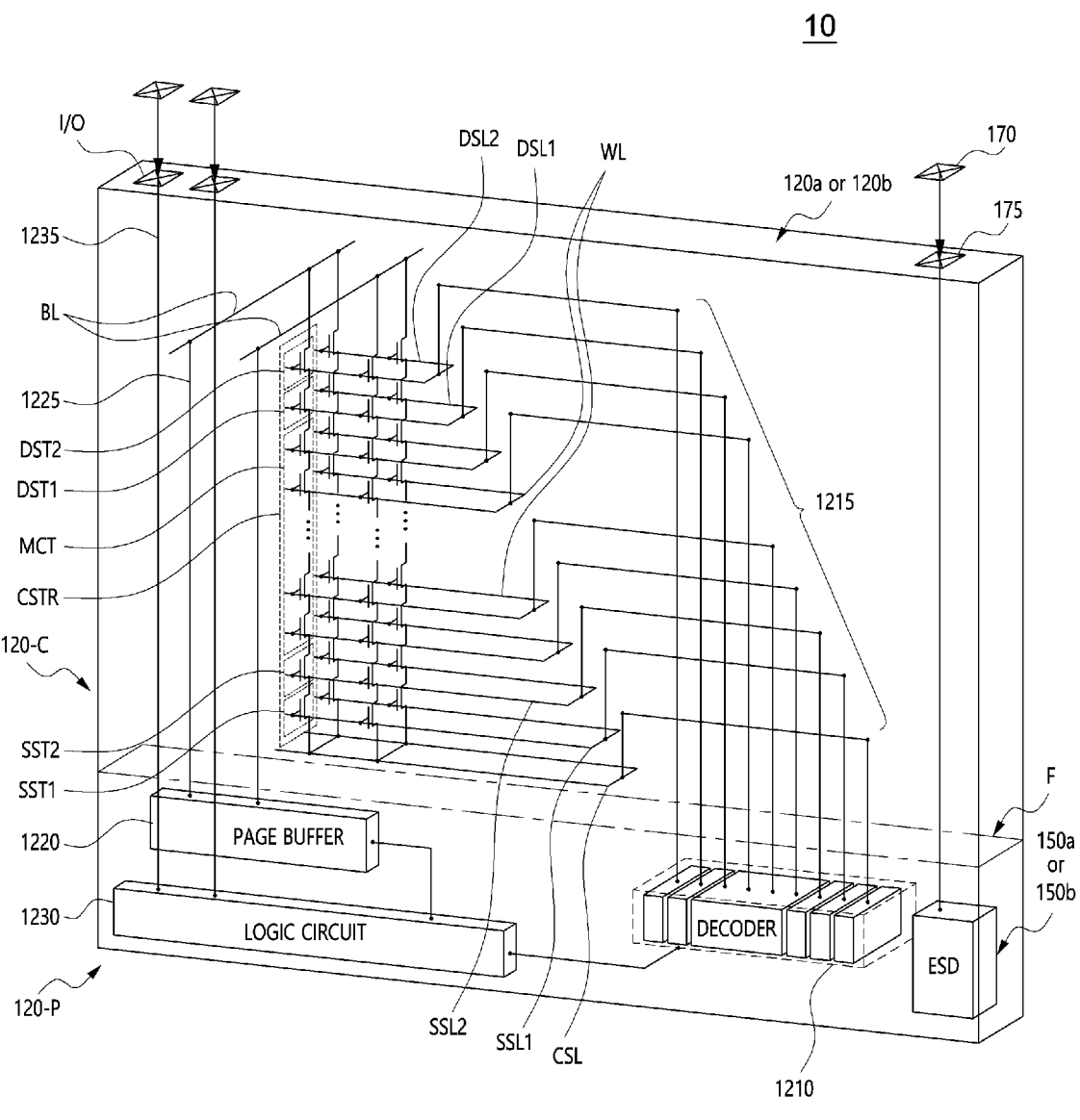
FIG. 2 is a perspective view illustrating a semiconductor memory device in accordance with embodiments of the present disclosure.

FIG. 1 is a plan view illustrating a semiconductor memory device in accordance with embodiments of the present disclosure, and FIG. 2 is a perspective view illustrating a semiconductor memory device in accordance with embodiments of the present disclosure.

Referring to FIGS. 1 and 2, a semiconductor memory device 10 may include a semiconductor substrate 100, a plurality of memory cell arrays 120a and 120b, an ESD protection circuit 150a and 150b, a plurality of bonding pads 170 and a plurality of connection pads 175.

For example, the semiconductor substrate 100 may include Si, Ge, SiGe, etc. Alternatively, the semiconductor substrate 100 may include a polysilicon substrate, a silicon-on-insulator (SOI) substrate, a germanium-on-insulator (GeOI) substrate, etc.

The memory cell arrays 120a and 120b may include non-volatile memory cells. As a non-limiting example, the memory cell arrays 120a and 120b may include three-dimensional NAND flash memory cells.

The memory cell arrays 120a and 120b may each include a first region 120-P and a second region 120-C. As shown in FIG. 2, the second region 120-C may be positioned over the first region 120-P. A reference numeral F may indicate a boundary surface between the first region 120-P and the second region 120-C. Although not depicted in drawings, alternatively, the first region 120-P may be horizontally arranged on a plane on which the second region 120-C may be placed. For example, the first region 120-P may be horizontally arranged on the semiconductor substrate 100.

The first region 120-P may correspond to a peripheral circuit region in which a decoder circuit 1210, a page buffer 1220 and a logic circuit 1230 may be arranged. The second region 120-C may correspond to a cell region in which a common source line CSL, a bit line BL and a plurality of memory cell strings CSTR may be positioned.

For example, in FIG. 2, the common source line CSL may be located in a bottom portion of the second region 120-C.

The bit line BL may be located in an upper portion of the second region 120-C. At least one source selection line (e.g., SSL1 and SSL2), a plurality of word lines WL and at least one drain selection line (e.g., DSL1 and DSL2) may be stacked between the common source line CSL and the bit line BL.

The memory cell string CSTR may include at least one source selection transistor, a plurality of memory cell transistor MCT and at least one drain selection transistor. For example, the at least one source selection transistor (e.g., SST1 and SST2), the plurality of memory cell transistor MCT and the at least one drain selection transistor (e.g., DST1 and DST2) in one memory cell string CSTR may be connected in series with each other.

The at least one source selection transistor may be located adjacent to the common source line CSL. For example, the at least one source selection transistor may be a first source selection transistor SST1 or a second source selection transistor SST2. The first source selection transistor SST1 may be connected to the common source line CSL to control an erase operation of a selected memory cell transistor MCT. The second source selection transistor SST2 may be connected in series to the first source selection transistor SST1. The second source selection transistor SST2 may act as a ground selection transistor. The first source selection transistor SST1 may use the first source selection line SSL1 as a gate electrode. The second source selection transistor SST2 may use the second source selection line SSL2 as a gate electrode.

The plurality of the memory cell transistors MCT may be connected in series with each other between the at least one source selection transistor, for example, the second source selection transistor SST2 and the at least one drain selection transistor. The memory cell transistors MCT may use the word lines WL as gate electrodes to selectively perform a memory operation.

The at least one drain selection transistor may be arranged between the bit line BL and an uppermost memory cell transistor MCT. A drain selection transistor may be a first drain selection transistor DST1 or a second drain selection transistor DST2. Similar to the first source selection transistor SST1 described above, the first drain selection transistor DST1 may be electrically connected to the uppermost memory cell transistor MCT to control the erase operation of a selected memory cell transistor MCT. The second drain selection transistor DST2 may be connected between the first drain selection transistor DST1 and a bit line BL. The second drain selection transistor DST2 may be configured to select any one of the memory cell strings CSTR connected to the bit line BL. The first drain selection transistor DST1 may use the first drain selection line DSL1 as a gate electrode. The second drain selection transistor DST2 may use the second drain selection line DSL2 as a gate electrode.

At least one of the first source selection transistor SST1 and the first drain selection transistor DST1 may erase data in the memory cell transistor MCT using a gate induced drain leakage (GIDL).

In some embodiments, the two source selection transistors SST1 and SST2 and the two drain selection transistors DST1 and DST2 may be illustrated, but embodiments contemplated by the disclosure are not limited thereto.

The common source line CSL, the at least one source selection line, the word lines WL and the at least one drain selection line may be electrically connected with the decoder circuit 1210 through first connection wirings 1215.

The bit line BL may be electrically connected with the page buffer 1120 through second connection wirings 1225 that extend from the first region 120-P to the second region 120-C.

The decoder circuit 1210 and the page buffer 1220 in the first region 120-P may control at least one of the memory cell transistors MCT. The decoder circuit 1210 and the page buffer 1220 may be controlled by the logic circuit 1230. The logic circuit 1230 may be electrically connected to an input/output pad I/O. The logic circuit 1230 and the input/output pad I/O may be electrically connected with each other through an input/output wiring 1235. The input/output pad I/O may interface with a controller.

The controller may control the semiconductor memory device 10 in response to a control command. The decoder circuit 1210 may independently activate the source selection lines SSL1 and SSL2, the word lines WL, and the drain selection lines DSL1 and DSL2. The page buffer 1220 may control separate operations of the selected memory cell, for example, a read operation, a write operation, etc.

The semiconductor memory device 10 may be electrically connected with an external device through the bonding pads 170. For example, the bonding pads 170 may be arranged on one upper edge or surface portion of the first memory cell array 120*a* and/or the second memory cell array 120*b*. Alternatively, the bonding pad 170 may partially overlap the first memory cell array 120*a* and/or the second memory cell array 120*b* when viewed in the vertical direction or in a plan view.

The connection pads 175 may be arranged between the first memory cell array 120*a* and the second memory cell array 120*b*. The connection pads 175 may function as an electrical medium between the bonding pads 170 and the ESD protection circuit 150 through redistribution processes. The connection pads 175 may have a size smaller than a size of the bonding pad 170. The bonding pads 170 and connection pads 175 in FIG. 2 may be positioned on different heights or vertical levels. Alternatively, the bonding pads 170 may be substantially coplanar with the connection pads 175.

The ESD protection circuit 150 may be arranged in the first memory cell array 120*a* and the second memory cell array 120*b* adjacent to the connection pads 175. For example, the ESD protection circuit 150 may be disposed in the first region 120-P of the first and second memory cell arrays 120*a* and 120*b* to discharge a static electricity flowing through the pads.

Figure 3:
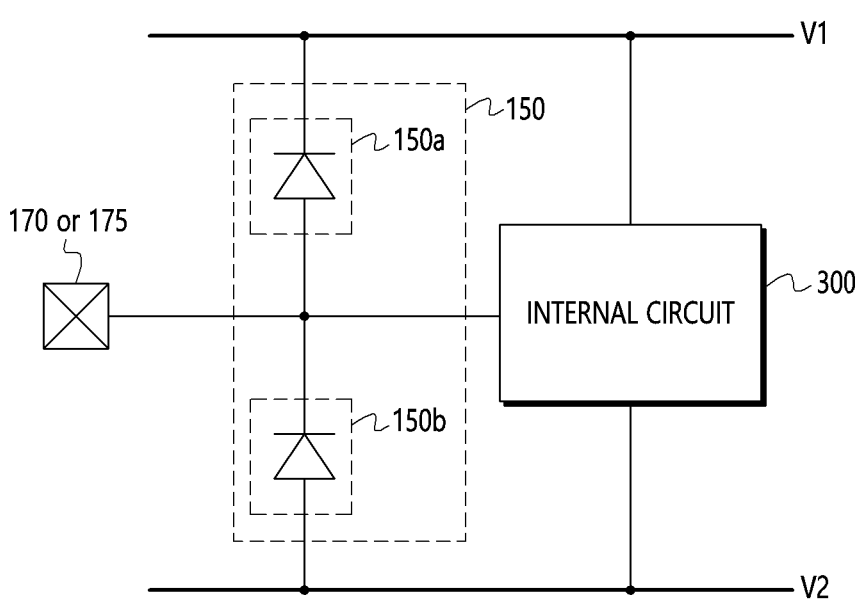
FIG. 3 is a circuit diagram illustrating an ESD protection circuit in accordance with embodiments of the present disclosure.

FIG. 3 is a circuit diagram illustrating an ESD protection circuit in accordance with embodiments of the present disclosure.

Referring to FIG. 3, an ESD protection circuit 150 may be connected between a bonding pad 170 or a connection pad 175 and an internal circuit 300. The internal circuit 300 may include circuits in the first region 120-P and the memory string CSTR and the electrode lines CSL, SSL1, SSL2, WL, DSL1, DSL2, BL, etc., in the second region 120-C.

The ESD protection circuit 150 may include a first protecting unit 150*a* and a second protecting unit 150*b*. The first protecting unit 150*a* may be connected between the bonding pad 170 or connection pad 175 and a first power line V1. The first protecting unit 150*a* may include at least one first diode D1. The first diode D1 may include an anode and a cathode. The anode of the first diode D1 may be electrically connected to the bonding pad 170 or connection pad 175. The cathode of the first diode D1 may be electrically connected to the first power line V1. The first power line V1 may transmit a driving voltage. In some embodiments, the first protecting unit 150*a* may include one first diode D1. Alternatively, the first protecting unit 150*a* may include a plurality of first diodes D1, connected in series or in parallel with each other, to have a finger structure. The finger structure of the diode may be disclosed in U.S. Pat. No. 8,203,183, which is incorporated herein by reference.

The second protecting unit 150*b* may include at least one second diode D2. The second diode D2 may include an anode and a cathode. The anode of the second diode D2 may be connected to a second power line V2, through which a voltage lower than a voltage of the first power line V1 (for example, a Vss voltage) may be transmitted. The cathode of the second diode D2 may be electrically connected to the bonding pad 170 or connection pad 175. In some embodiments, the second protecting unit 150*b* may include one second diode D2. Alternatively, the second protecting unit 150*b* may include a plurality of second diodes D2 having a finger structure.

A large amount of abnormal or undesired positive static electricity may flow from the bonding pad 170 or connection pad 175. When a difference between a voltage of the static electricity and the voltage of the first power line V1 is above a threshold voltage of the first diode D1, the first diode D1 in the first protecting unit 150*a* may be turned-on. Thus, a current path may be generated between the bonding pad 170 or connection pad 175 and the first power line V1 to effectively discharge the positive static electricity, thereby preventing the positive static electricity from entering into and damaging the internal circuit 300.

A large amount of abnormal or undesired negative static electricity may flow from the bonding pad 170 or connection pad 175. When a difference between a voltage of the static electricity and the voltage of the second power line V2 is above a threshold voltage of the second diode D2, the second diode D2 in the second protecting unit 150*b* may be turned-on. Thus, a current path may be generated between the bonding pad 170 or connection pad 175 and the second power line V2 to effectively discharge the negative static electricity, thereby preventing the negative static electricity from entering into and damaging the internal circuit 300.

In some embodiments, numbers of the first and second diodes D1 and D2 in the first and second protecting units 150*a* and 150*b* may be set in accordance with previously obtained data.

FIGS. 4A to 4F are plan views illustrating a method of manufacturing an ESD protection circuit and a pad region in accordance with embodiments of the present disclosure. FIGS. 5A to 5F are cross-sectional views taken along a line a-a' in FIGS. 4A to 4F, respectively. FIGS. 6A to 6F are cross-sectional views taken along a line b-b' in FIGS. 4A to 4F, respectively. FIGS. 7A to 7F are cross-sectional views taken along a line c-c' in FIGS. 4A to 4F, respectively.

FIGS. 4A to 4F may show a diode region and a pad region corresponding to the diode region in which two first diodes D1 in a first protecting unit of an ESD protection circuit may be formed. FIGS. 5A to 5F may show facing portions of an anode and a cathode in the region where the first diode D1 may be formed. FIGS. 6A to 6F may show a cathode between the anode and the pad region. FIGS. 7A to 7F may show the pad region.

Referring to FIGS. 4A, 5A, 6A and 7A, an isolation layer 205 may be formed on a semiconductor substrate 200. The isolation layer 205 may define an active region ACT where the first diode D1 corresponding to a protection element may be formed. Although not depicted in drawings, the semiconductor substrate 200 may include a conductive well, for example, a P well or an N well. For example, the isolation layer 205 may have a shallow trench isolation (STI) structure. The isolation layer 205 may be formed together with isolation layers configured to define peripheral circuits in the first region 120-P in FIG. 2.

The active region ACT where the first diode D1 may be formed may include a cathode-defined region corresponding to a first electrode region and an anode-defined region corresponding to a second electrode region. First conductive type impurities may be selectively implanted into the anode-defined region to form an anode region 210. Second conductive type impurities may be selectively implanted into the cathode-defined region to form a cathode region 215. The first conductive type impurities may be opposite to the second conductive type impurities. For example, the first conductive type impurities may include P type impurities and the second conductive type impurities may include N type impurities.

In some embodiments, after forming the anode region 210, the cathode region 215 may be formed. Alternatively, after forming the cathode region 215, the anode region 210 may be formed. Further, the anode region 210 may be formed together with the process for implanting the first conductive impurities into the first region 120-P. The cathode region 215 may be formed together with the process for implanting the second conductive impurities into the first region 120-P.

In some embodiments, the selective implantation may include exposing a selected region by a mask process and performing an ion implantation process.

The cathode region 215 of the first diode D1 may have a planar frame shape. For example, the cathode region 215 may have a quadrangular frame shape. The anode region 210 of the first diode D1 may be arranged in a space surrounded by the cathode region 215. For example, the anode region 210 may have a bar shape and may extend in y-direction. The anode region 210 may be spaced apart from the cathode region 215. The isolation layer 205 may be positioned between the anode region 210 and the cathode region 215. The isolation layer 205 may surround the anode region 210.

In the figures, a reference numeral DA1 may indicate a region where the first diode D1 may be formed (hereinafter referred to as a first diode region). A reference numeral PA may indicate a region where a pad may be formed (hereinafter referred to as a pad region). As mentioned above, the bonding pad 170 or the connection pad 175 may be arranged in the pad region PA. A pull-up/pull-down driver or a data input/output circuit may be provided under the bonding pad 170 and/or the connection pad 175. The pad region PA may include a pad connection region PA1 and a pad formation region PA2.

Referring to FIGS. 4B, 5B, 6B and 7B, a first insulating interlayer 220 may be formed on the semiconductor substrate 200 with the anode region 210 and the cathode region 215. The first insulating interlayer 220 may be etched to form first contact holes configured to partially expose the anode region 210 and the cathode region 215. The first contact holes may be filled with a conductive material to form a first contact CT1a and CT1b. In some embodiments, the first contacts CT1a and CT1b may be formed in the anode region 210 and the cathode region 215, respectively. Alternatively, the number of the first contacts CT1a and CT1b may be changed in accordance with areas of the anode region 210 and the cathode region 215.

First lower conductive wirings 225a and 225b corresponding to the anode region 210 and the cathode region 215, respectively, may be formed on the first insulating interlayer 220. In some embodiments, "a correspondence of two elements" on different planes may be interpreted as an overlapping of the two elements, with a middle element between the two elements. In addition, "a correspondence of two elements on a same plane" may be interpreted as the two elements arranged in parallel. The first lower conductive wiring 225a corresponding to the anode region 210 may be electrically connected with the anode region 210 through the first contact CT1a. The first lower conductive wiring 225b corresponding to the cathode region 215 may be electrically connected with the cathode region 215 through the first contact CT1b. The first lower conductive wiring 225a may have a width substantially the same as a width of the anode region 210. Alternatively, the width of the first lower conductive wiring 225a may be wider or narrower than the width of the anode region 210. The first lower conductive wiring 225b may have cross-sectional widths that substantially the same as those of the cathode region 215. Alternatively, the cross-sectional widths of the first lower conductive wiring 225b may be wider or narrower than the cross-sectional widths of the cathode region 215.

Referring to FIGS. 4C, 5C, 6C and 7C, a second insulating interlayer 230 may be formed on the first insulating interlayer 220 with the first lower conductive wiring 225a and 225b. The second insulating interlayer 230 may be etched to form second contact holes configured to partially expose the first lower conductive wiring 225a and 225b. The second contact holes may be filled with a conductive material to form second contacts CT2a and CT2b. The second contact CT2a may be formed on the first lower conductive wiring 225a corresponding to the anode region 210. The second contact CT2b may be formed on the first lower conductive wiring 225b corresponding to the cathode region 215. The second contacts CT2a and CT2b and the first contacts CT1a and CT1b may be formed at different positions or in corresponding positions.

Second lower conductive wirings 235a and 235b may be formed on the second insulating interlayer 230 with the second contacts CT2a and CT2b. The second lower conductive wirings 235a and 235b may be formed to correspond to or be overlapped with the anode region 210 and the cathode region 215 in a manner similar to the first lower conductive wirings 225a and 225b. The second lower conductive wirings 235a and 235b may be electrically connected with the first lower conductive wirings 225a and 225b through the second contacts CT2a and CT2b.

Referring to FIGS. 4D, 5D, 6D and 7D, a third insulating interlayer 240 may be formed on the second insulating interlayer 230 with the second lower conductive wirings 235a and 235b. The third insulating interlayer 240 may be etched to form third contact holes configured to partially expose the second lower conductive wirings 235a and 235b. The third contact holes may be filled with a conductive material to form a third contact CT3a and CT3b. A third lower conductive wirings 245a, 245b and 245P may be formed on the third insulating interlayer 240. The third lower conductive wirings 245a, 245b and 245P may electrically make contact with the third contacts CT3a and CT3b.

The third lower conductive wirings 245a, 245b and 245P may include an anode facing unit 245a, a cathode facing unit 245b and an ESD connection unit 245P.

The anode facing unit 245a may be overlapped with the second lower conductive wiring 235a. For example, the anode facing unit 245a may be formed to overlap the second lower conductive wiring 235a. The anode facing unit 245a may include a first line pattern LPa1 and a second line pattern LPa2. The first and second line patterns LPa1 and LPa2 may be electrically connected with the second lower conductive wiring 235a through the third contacts CT3a. In some embodiments, the anode facing unit 245a, that is, the first and second line patterns LPa1 and LPa2, may be extended in the y-direction. The first and second line patterns LPa1 and LPa2 may be connected to the ESD connection unit 245P arranged at the pad region PA.

The cathode facing unit 245b may be overlapped with the second lower conductive wiring 235b. In some embodiments, in order to decrease a facing portion between the cathode facing unit 245b and the anode facing unit 245a, the cathode facing unit 245b may be positioned over portions of the second lower conductive wiring 235b extended in the y-direction (hereinafter referred to as a perpendicular portion). The cathode facing unit 245b may include a first line pattern LPb1 and a second line pattern LPb2. The cathode facing unit 245b, for example, the first and second line pattern LPb1 and LPb2 may be electrically connected with the second lower conductive wiring 235b through the third contacts CT3b. In some embodiments, the cathode facing unit 245b that is, the first and second line patterns LPb1 and LPb2, extend in the y-direction. The first and second line patterns LPb1 and LPb2 may be spaced apart from the ESD connection unit 245P to reduce a coupling capacitance.

The ESD connection unit 245P may be formed at the pad connection region PA1 facing the first diode D1. The ESD connection unit 245P may be connected to the anode facing unit 245a. In some embodiments, the ESD connection unit 245P may include a plurality of horizontal patterns 245Px and a plurality of perpendicular patterns 245Py intersected with each other to form a mesh pattern having a width wider than the width of the anode region 210. For example, the horizontal pattern 245Px may have a length longer than a width of the anode facing unit 245a and shorter than a length of the first diode region DA1 in the x-direction. The horizontal pattern 245Px is configured to directly make contact with the anode facing unit 245a and may be arranged on the second lower conductive wiring 235b. For example, the plurality of horizontal patterns 245Px and the plurality of perpendicular patterns 245Py may be formed on the same plane, that is, the third insulating interlayer 240. The ESD connection unit 245P may be spaced apart from an adjacent ESD connection unit 245P so that the adjacent ESD connection units 245P may be electrically isolated from each other.

The third lower conductive wiring including the anode facing unit 245a, the cathode facing unit 245b and the ESD connection unit 245P may have a first thickness T1, which is thicker than thicknesses of the first lower conductive wiring 225a and 225b and the second lower conductive wiring 235a and 235b.

A fourth insulating interlayer 250 may be formed on the third insulating interlayer 240 with the third lower conductive wiring 245a, 245b and 245P to form the first region 120-p corresponding to a peripheral circuit region.

The first to third lower conductive wirings 225a, 225b, 235a, 235b, 245a, 245b and 245P in the first region 120-P may include a same material or different materials. For example, the first to third lower conductive wirings 225a, 225b, 235a, 235b, 245a, 245b and 245P may include W, Au, Ag, Cu, Al, TiAlN, WN, Ir, Pt, Pd, Ru, Zr, Rh, Ni, Co, Cr, Sn, Zn, etc.

The common source line CSL and the memory cell string CSTR corresponding to the second region 120-C may be formed on the fourth insulating interlayer 250. A buried insulation layer 255 may be formed on the fourth insulating interlayer 250 with the common source line CSL and the memory cell string CSTR. For example, the buried insulation layer 255 may have a thickness greater than the heights of the common source line CSL and the memory cell string CSTR. In some embodiments, the buried insulation layer 255 may include a single layer. Alternatively, the buried insulation layer 255 may include a multi-layers having a planarization layer. A reference numeral F may denote an interface between the first region 120-P and the second region 120-C.

The buried insulation layer 255 and the fourth insulating interlayer 250 may be etched to form buried contact holes. At least one selected portion of the cathode facing unit 245b and at least one selected portion of the ESD connection unit 245P are exposed by the buried contact holes.

The buried contact holes may then be filled with a conductive material to form buried contacts BC1 and BC2. The conductive material in the buried contacts BC1 and BC2 may have good gap-filling characteristic, such as tungsten as a non-limiting example. The buried contacts BC1 and BC2 may have a height that is at least substantially the same as a thickness of the buried insulation layer 255 or at least a height substantially the same as the second region 120-C.

In some embodiments, the buried contacts BC1 and BC2 may be formed on the cathode facing unit 245b and the ESD connection unit 245P, but not formed on the anode facing unit 245a. The buried contact BC2 on the ESD connection unit 245P may be positioned at an intersection point or area between the horizontal pattern 245Px and the perpendicular pattern 245Py.

Because buried contacts may not be formed on the anode facing unit 245a, the buried contact BC1 receiving the same voltage (i.e., cathode voltage) may exist in the first diode region DA1 so that a parasitic capacitance of the first diode region DA1 may not be generated. Further, because the buried contact BC1 connected to the cathode facing unit 245b and the buried contact BC2 connected to the ESD connection unit 245P may be spaced apart from each other by a wide gap, the parasitic capacitance, i.e., the coupling capacitance, may be reduced. In some embodiments, the wide gap may define a distance where an occurrence of the coupling capacitance between the buried contacts BC1 and BC2 is negligible.

Referring to FIGS. 4E, 5E, 6E and 7E, a first upper conductive wiring 260 and 262 may be formed on the buried insulation layer 255.

The first upper conductive wiring 260 on the first diode region DA1 may be configured to cover the first and second line patterns LPb1 and LPb2 of cathode facing unit 245b. For example, the first upper conductive wiring 260 may be configured to correspond to a portion of the cathode region 215. As described above, the cathode region 215 may have a frame structure including horizontal extending portions and perpendicular extending portions. For example, the first upper conductive wiring 260 may be arranged over the perpendicular portions of the cathode region 215. The first upper conductive wiring 260 may be electrically connected with the third lower conductive wiring 245b in the first region 120-P through the buried contact BC1.

The first upper conductive wiring 262 on the pad region PA may be arranged over an ESD connection unit 245P. For example, the first upper conductive wiring 262 may have a mesh shape substantially the same as the shape of the ESD connection unit 245P. The first upper conductive wiring 262 may be independently arranged in the pad connection region PA1. Alternatively, the first upper conductive wiring 262 may be electrically connected with the ESD connection unit 245P through the buried contact BC2.

In some embodiments, because the first upper conductive wiring 260 and 262 may not be arranged on the anode region 210, the parasitic capacitance, i.e., the coupling capacitance in the first diode region DA1 may be reduced.

In some embodiments, the first upper conductive wiring 260 and 262 may be formed together with the bit line BL. A thickness of the bit line BL may be generally determined in accordance with signal transmission properties and a length of the bit line BL. For example, the bit line BL may have a thickness T2 of about 5% to about 20% of the thickness T1 of the third lower conductive wirings 245a, 245b and 245P.

Referring to FIGS. 4F, 5F, 6F and 7F, a fifth insulating interlayer 265 may be formed on the buried insulation layer 255 with the first upper conductive wirings 260 and 262. The fifth insulating interlayer 265 may be etched to form via holes configured to expose the first upper conductive wirings 260 and 262.

The via hole may be filled with a conductive material to form via contacts VC1 and VC2. For example, via contact VC1 may be arranged on the first upper conductive wiring 260. Further, a plurality of via contacts VC1 may be positioned on each of a plurality of the first upper conductive wirings 260. Via contacts VC2 may be arranged on the first upper conductive wiring 262 over the pad connection region PA1.

A second upper conductive wiring 270 may be formed on the fifth insulating interlayer 265. The second upper conductive wiring 270 may include at least one power line 271 in the first diode region DA1 and a pad structure 272 in the pad region PA.

For example, the power line 271 may be extended in an x-direction (ex. horizontal direction) with sufficient line width. For example, the power line 271 may be arranged to cover most of the first diode region DA1. Thus, the power line 271 may have good power transmission properties. The power line 271 may be electrically connected with the first upper conductive wiring 260 through the via contact VC1. Further, the power line 271 may be electrically connected with a driving voltage source.

The pad structure 272 may include a pad 272a and a pad connection portion 272b. For example, the pad 272a may have a size corresponding to a size of the ESD protection circuit 150 in FIG. 3. The pad 272a may be arranged on the pad formation region PA2. In some embodiments, the pad 272a may have a size corresponding to a size of the first protecting unit 150a and the second protecting unit 150b.

The pad connection portion 272b may protrude from the pad 272a. In some embodiments, the pad connection portion 272b may include one protrusion per first diode D1. The pad connection portion 272b may be arranged at the first diode region DA1 in one-to-one relation. In some embodiments, the pad 272a may be connected to a plurality of pad connection portion 272b. The pad connection portion 272b may be electrically connected with the first upper conductive wiring 262 in the pad connection region PA1.

Generally, a diode and a pad in an ESD protection circuit may be connected with each other through a first upper conductive wiring of the second region 120-C substantially coplanar with the bit line BL. However, because the bit line BL and the first upper conductive wiring may be relatively arranged adjacent to the pad 270 at an uppermost layer of the second region 120-C, the first upper conductive wiring may be thin. Thus, the static electricity inputted through the pad 272a may deteriorate ESD characteristics when the static electricity is transmitted through a thin first upper conductive wiring.

In contrast, because the third lower conductive wiring 245P may be formed in the first region 120-P, the third lower conductive wiring 245P may be spaced apart from the pad 272a by no less than a thickness of the second region 120-C. In order to readily control the thickness of the third lower conductive wiring 245P compared to the first and second lower conductive wirings 225a, 225b, 235a and 235b, and in order to secure rapid signal transmission characteristics compared to the circuits in the first region 120-P, it may be required to provide the third lower conductive wiring 245P with a thickness that is thicker than the thickness of the bit line BL.

Therefore, the diode D1 of the ESD protection circuit 150 and the pad 272 configured to receive the external voltage may be electrically connected with each other through the uppermost conductive wiring of the first region 120-P having a relatively thick thickness, for example, the third upper conductive wiring 245P in place of the first upper conductive wiring 262. That is, the conductive wirings 225a, CT1a, 235a, CT2a and 245a, which may be electrically connected to the anode region 210 of the diode D1 and D2, (hereinafter, referred to as a lower conductive structure) and the conductive wirings VC2, 262 and BC2, which may be electrically connected to the pad 270, (hereinafter, referred to as an upper conductive structure) may be electrically connected with each other through the ESD connection unit 245P. Thus, the voltage of the static electricity inputted through the pad 272a may be transmitted through the upper conductive structure 270, VC2, 262 and BC2 and the ESD connection unit 245P having a relatively thick thickness to generate a voltage drop. The dropped voltage may be applied to the anode region 210 through the lower conductive structure 225a, CT1a, 235a, CT2a and 245a to perform the ESD operation. As a result, the dropped voltage may be transmitted to the ESD protection circuit 150 to improve robustness of the ESD protection circuit 150.

Figure 4A:
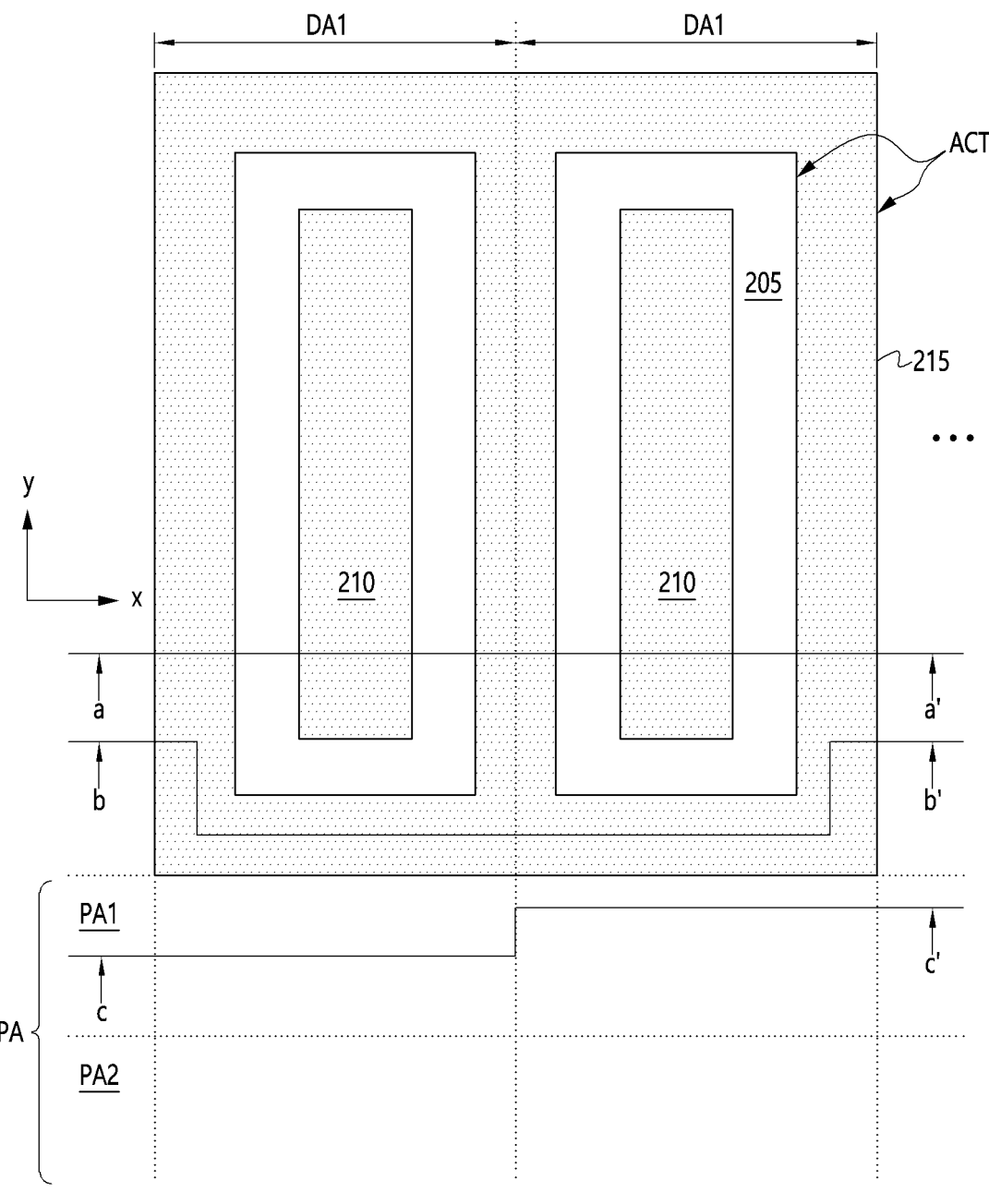
FIGS. 4A to 4F are plan views illustrating a method of manufacturing an ESD protection circuit and a pad region in accordance with embodiments of the present disclosure.
Figure 4B:
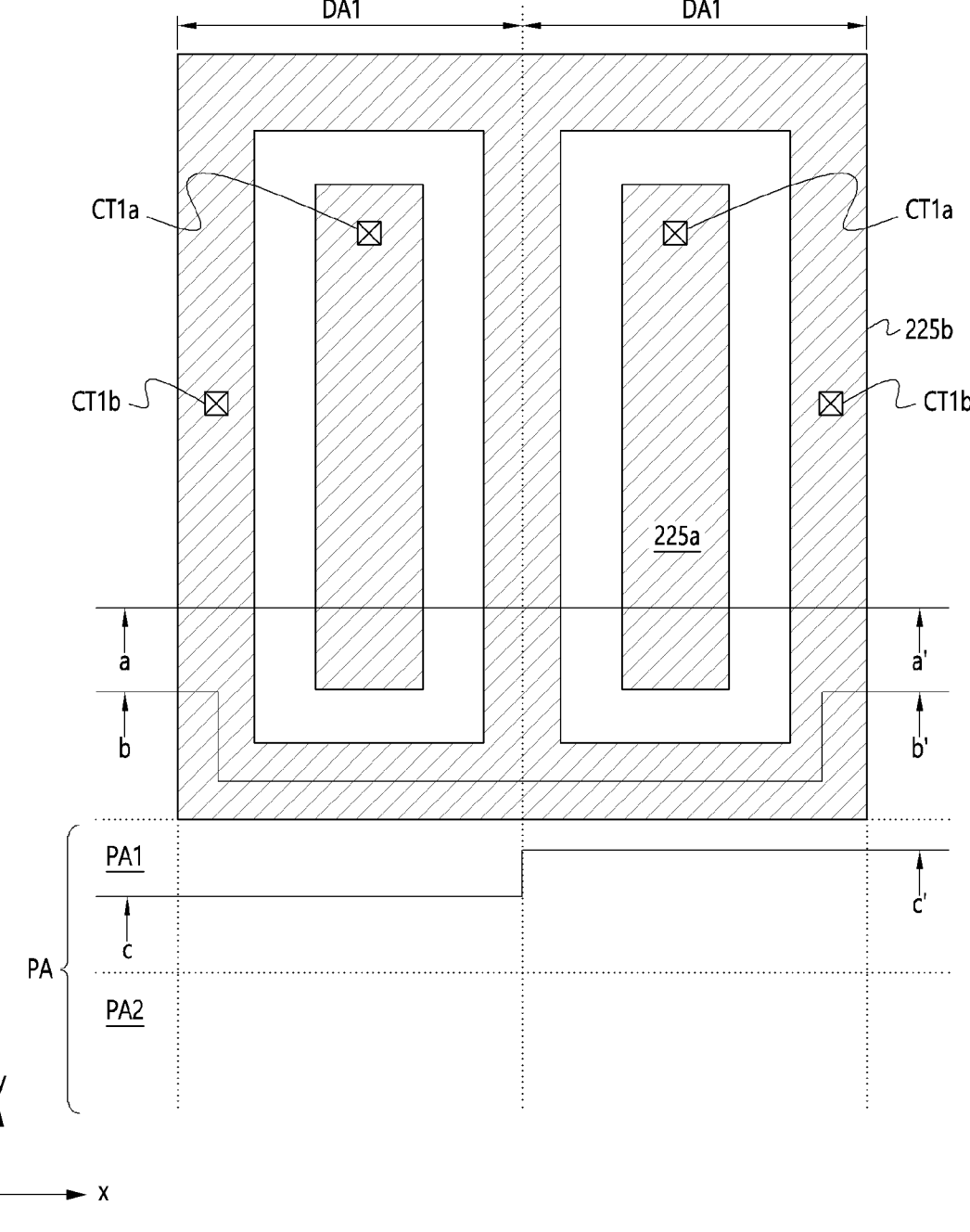
Figure 4C:
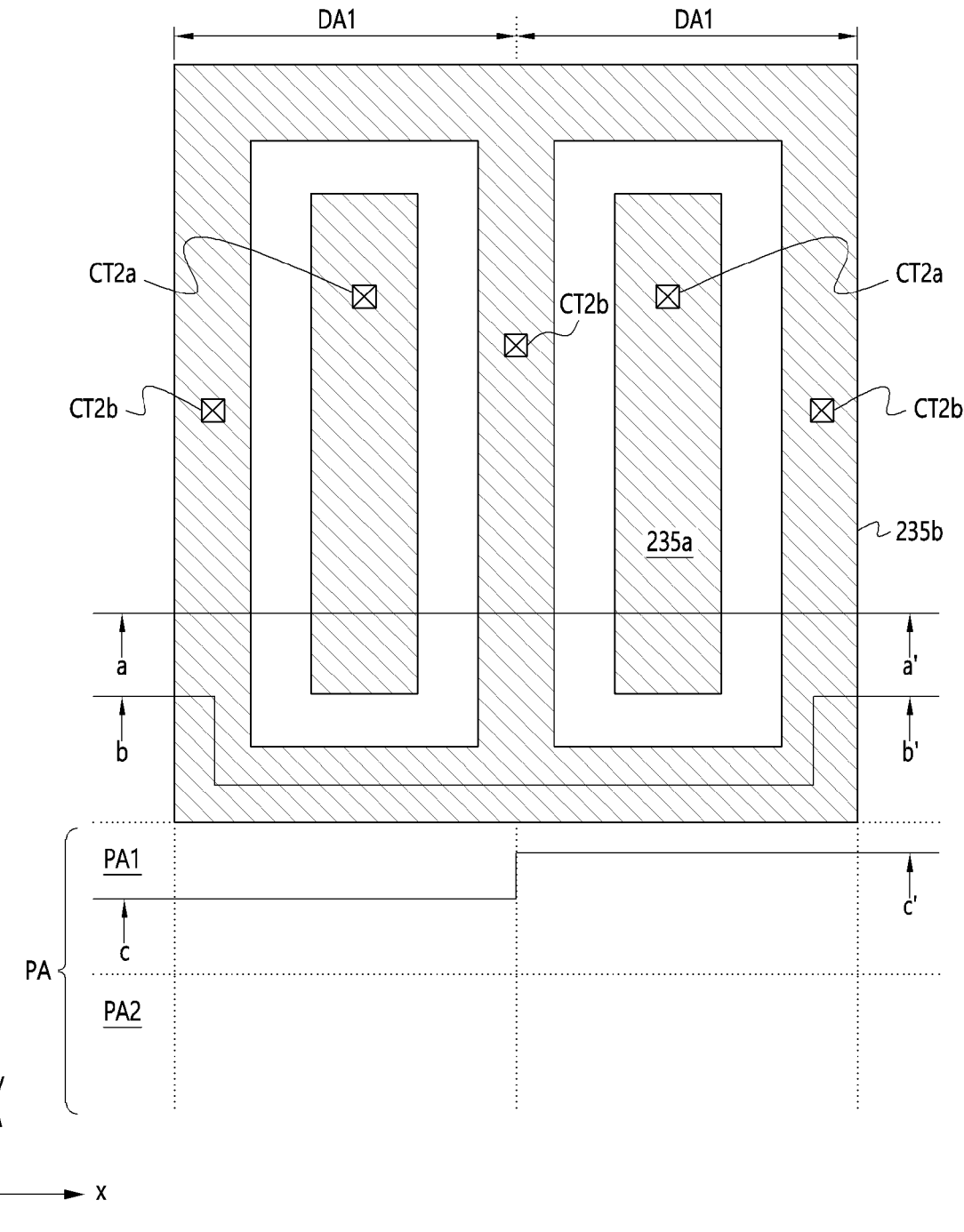
Figure 4D:
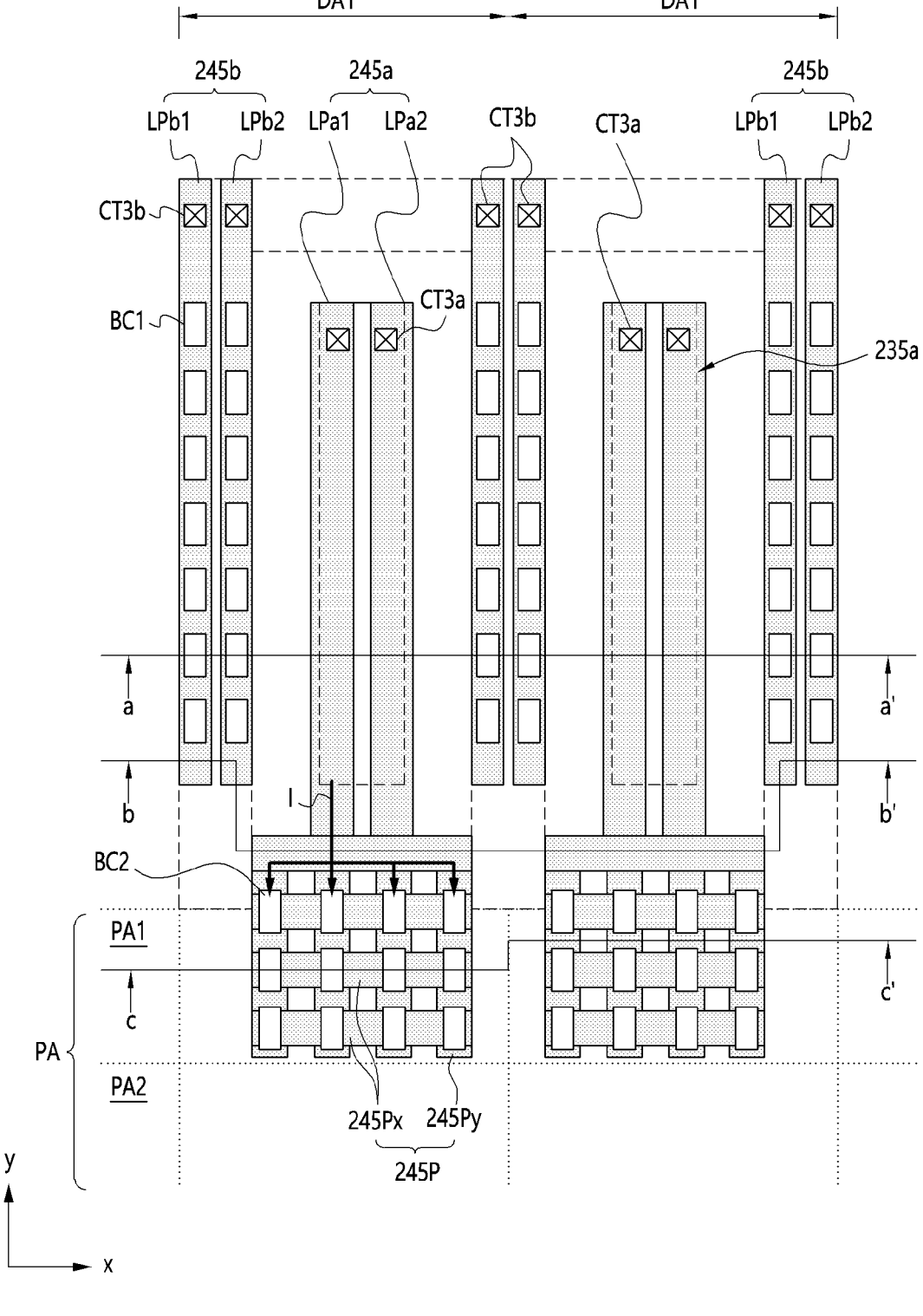
Figure 4E:
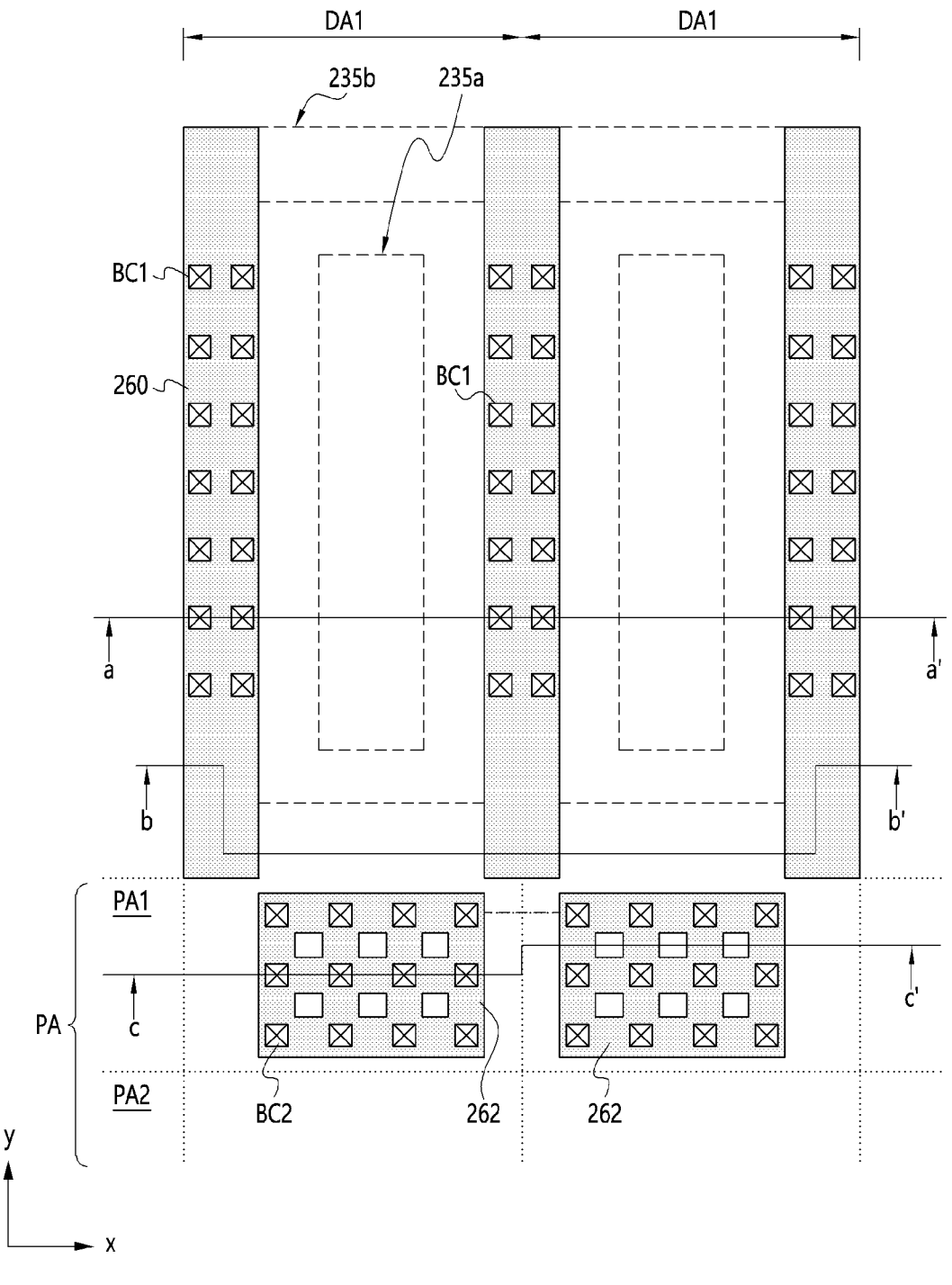
Figure 4F:
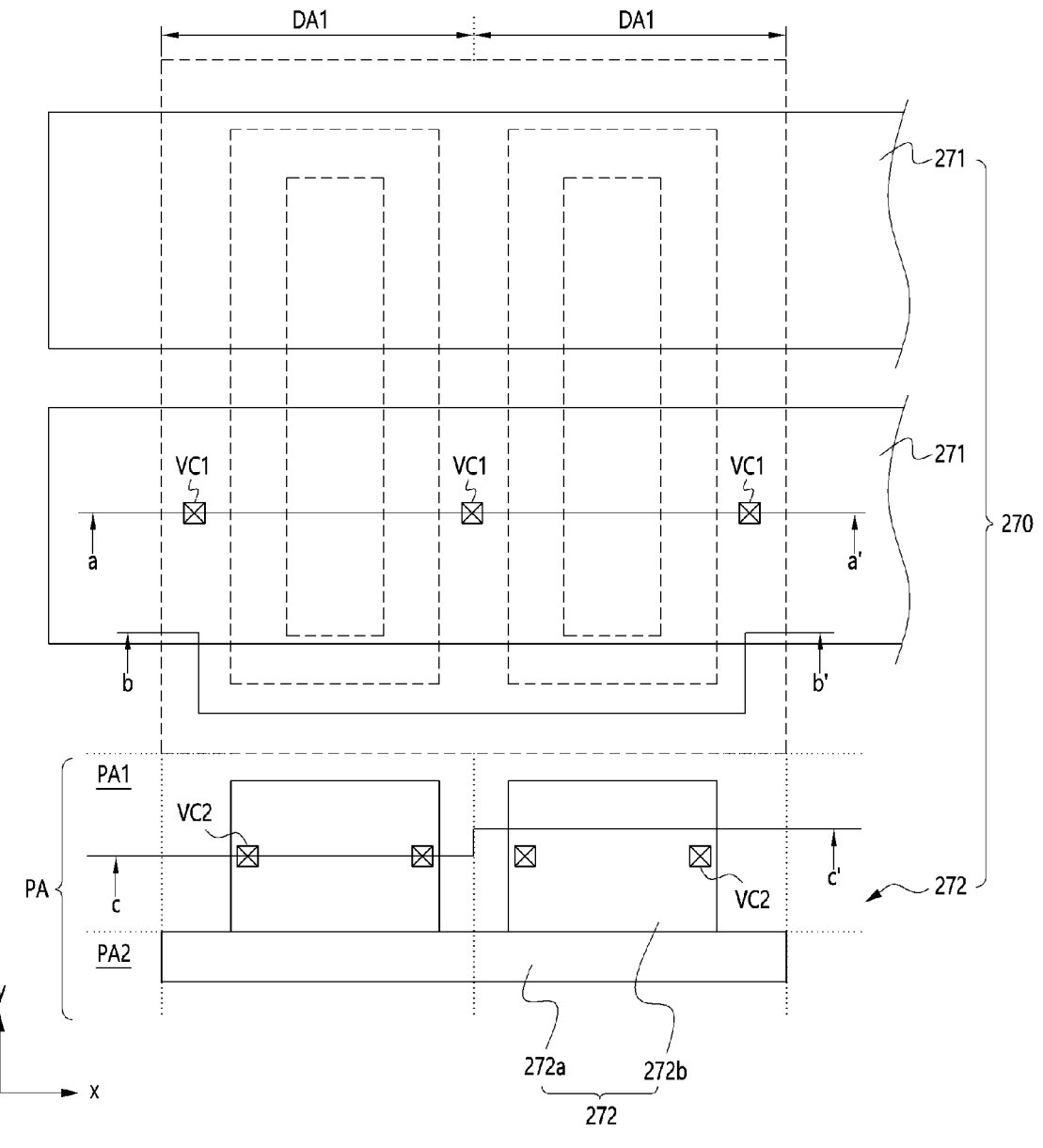
Figure 5A:
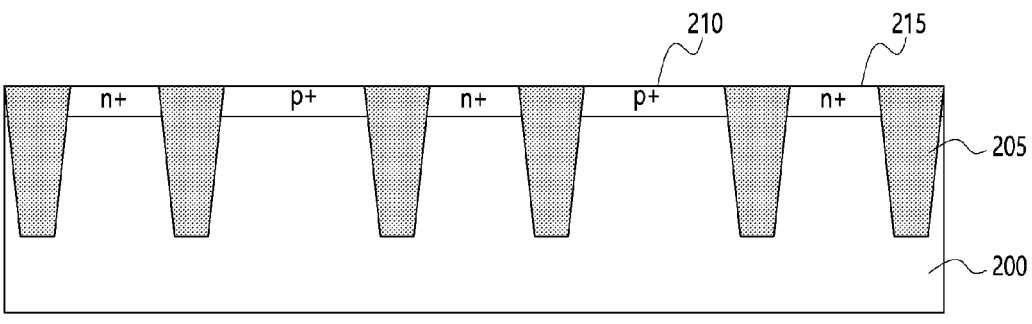
FIGS. 5A to 5F are cross-sectional views taken along a line a-a' in FIGS. 4A to 4F.
Figure 5B:
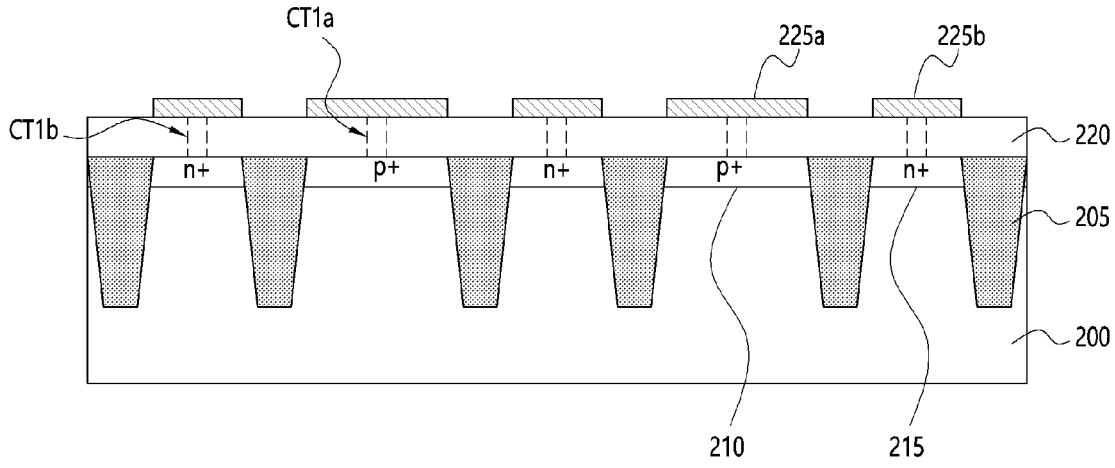
Figures 5C, 5D:
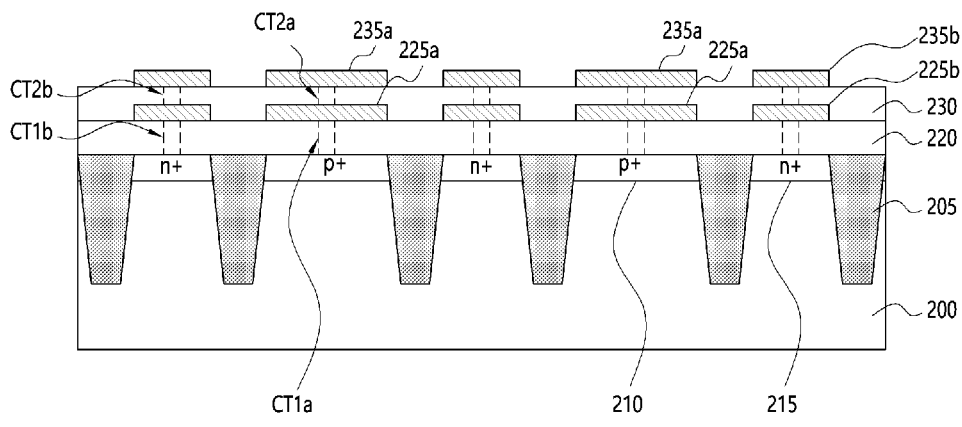
Figure 5E:
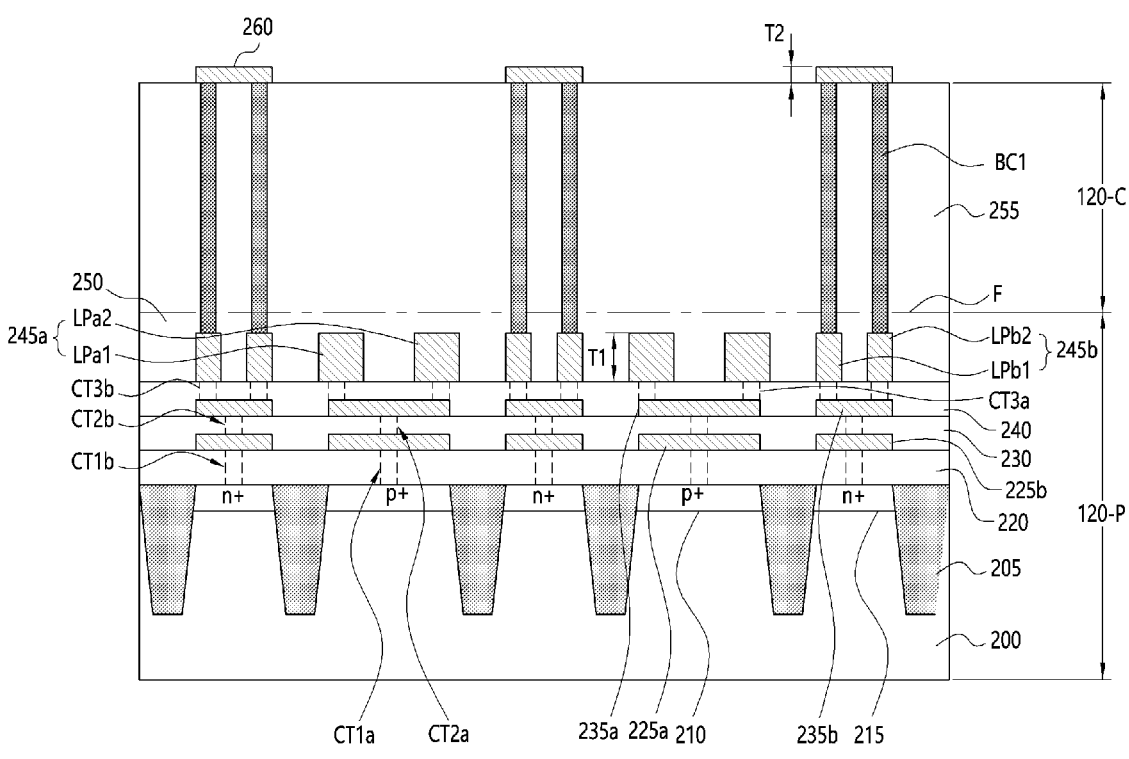
Figure 5F:
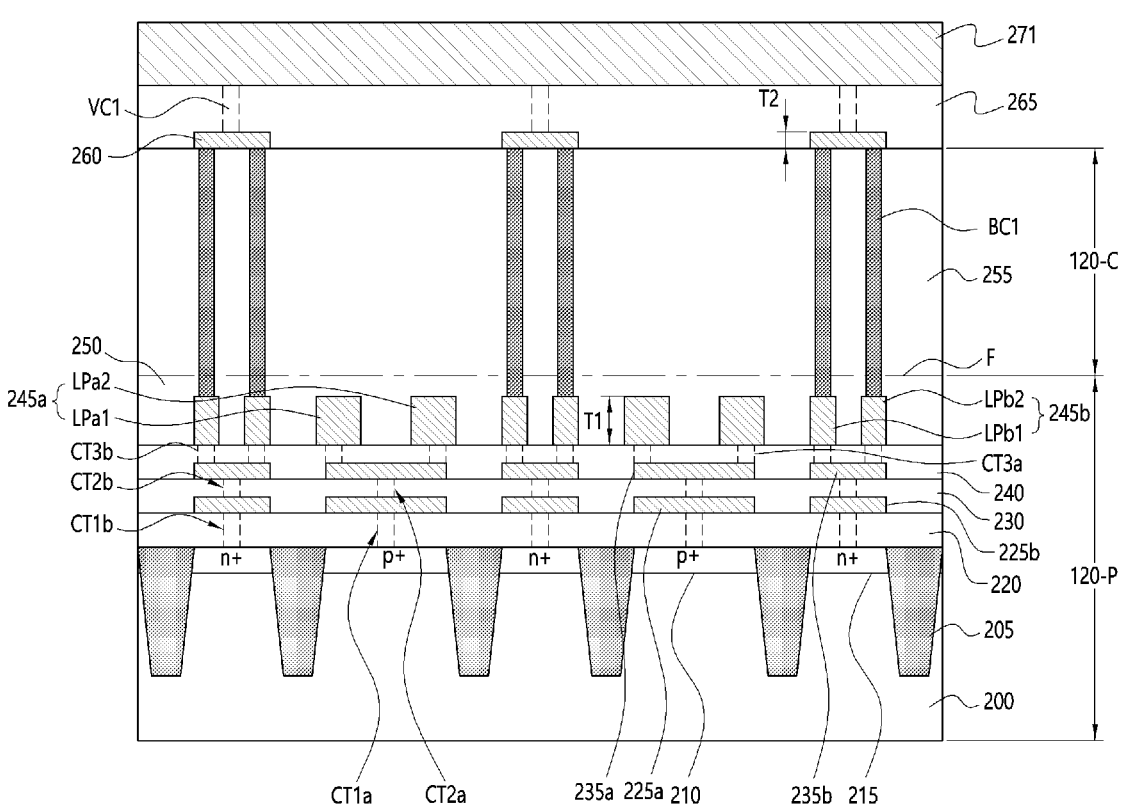
Figure 6A:
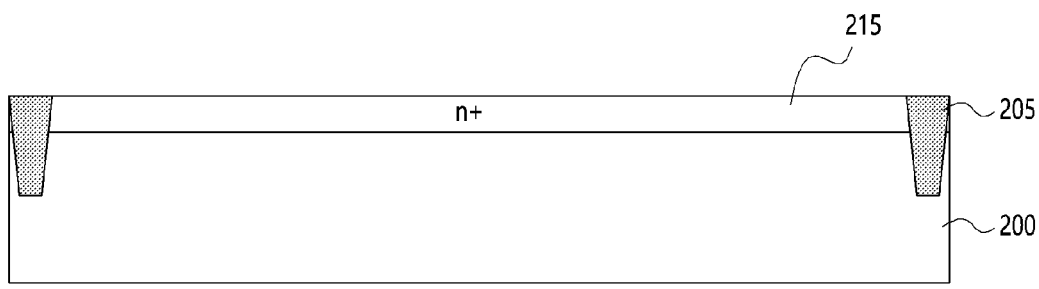
FIGS. 6A to 6F are cross-sectional views taken along a line b-b' in FIGS. 4A to 4F.
Figure 6B:
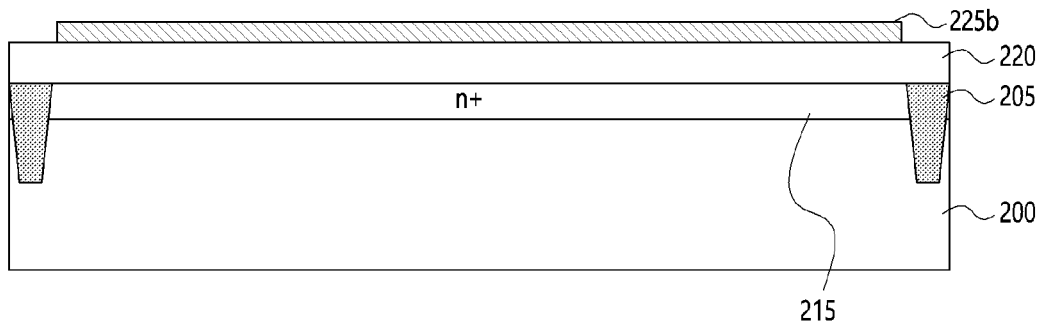
Figure 6C:
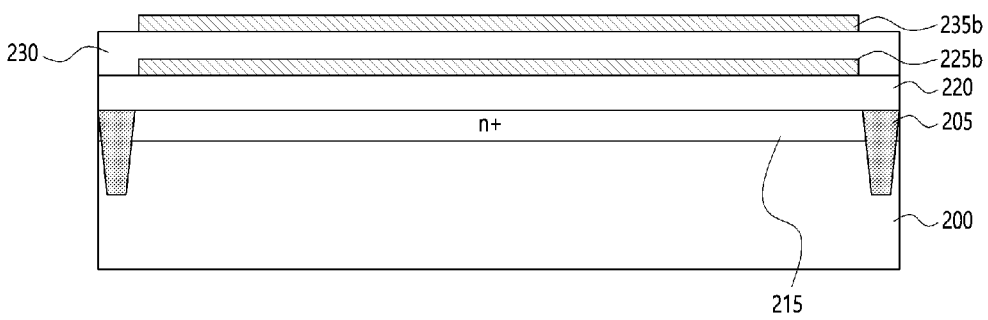
Figure 6D:
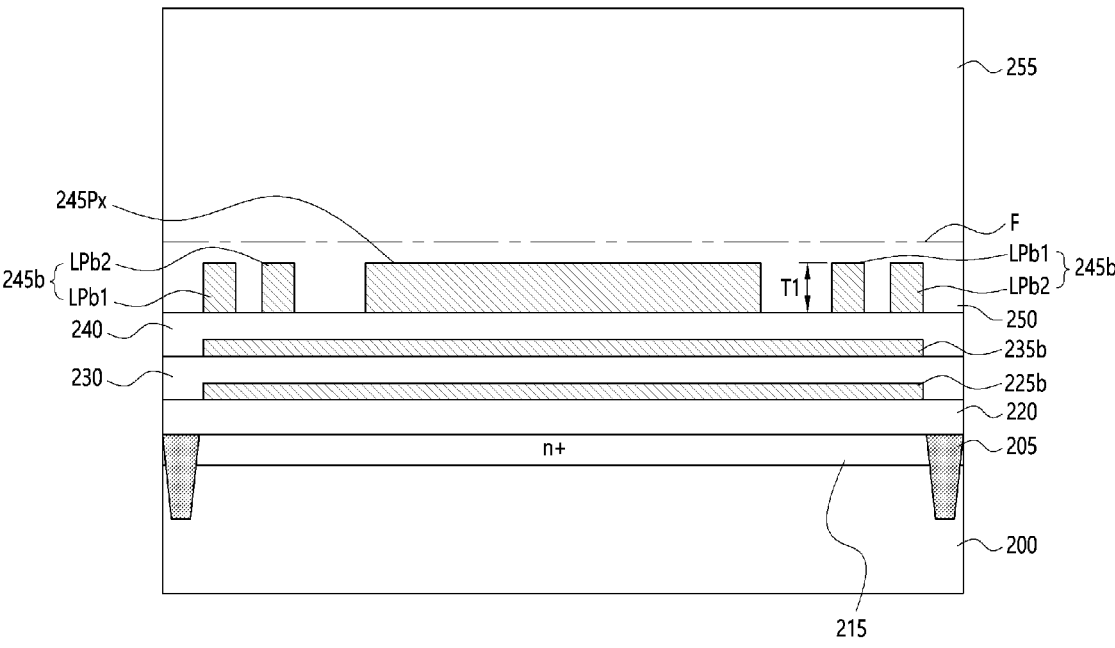
Figure 6E:
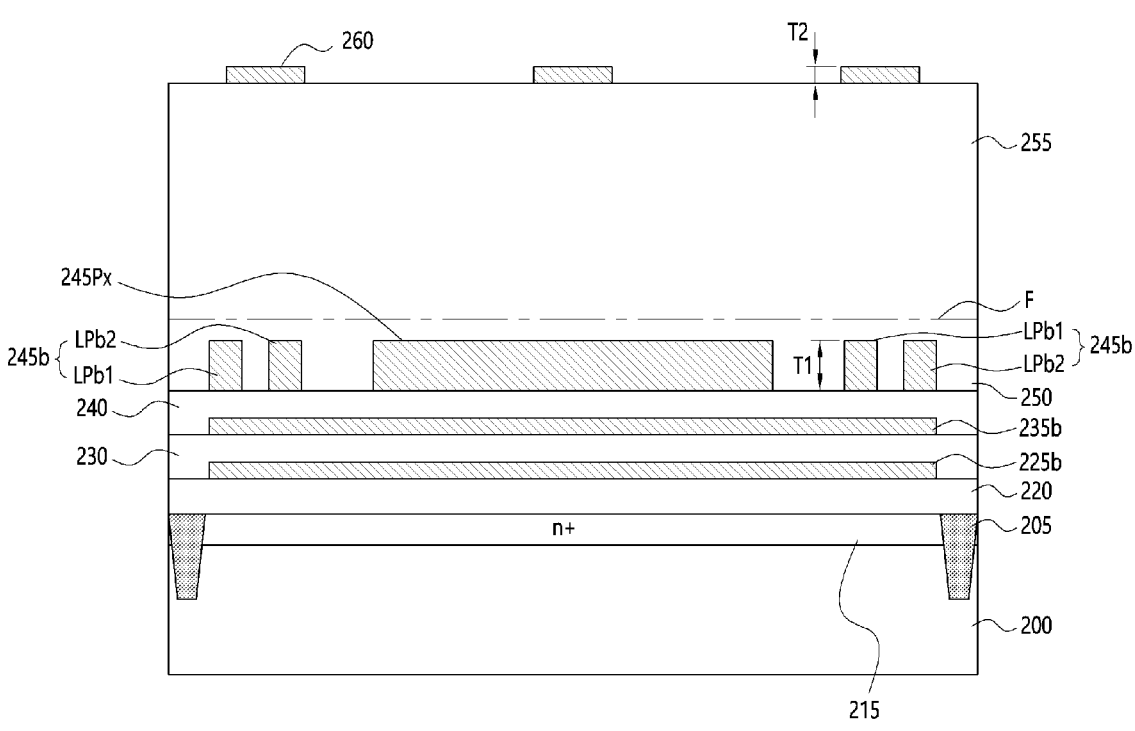
Figure 6F:
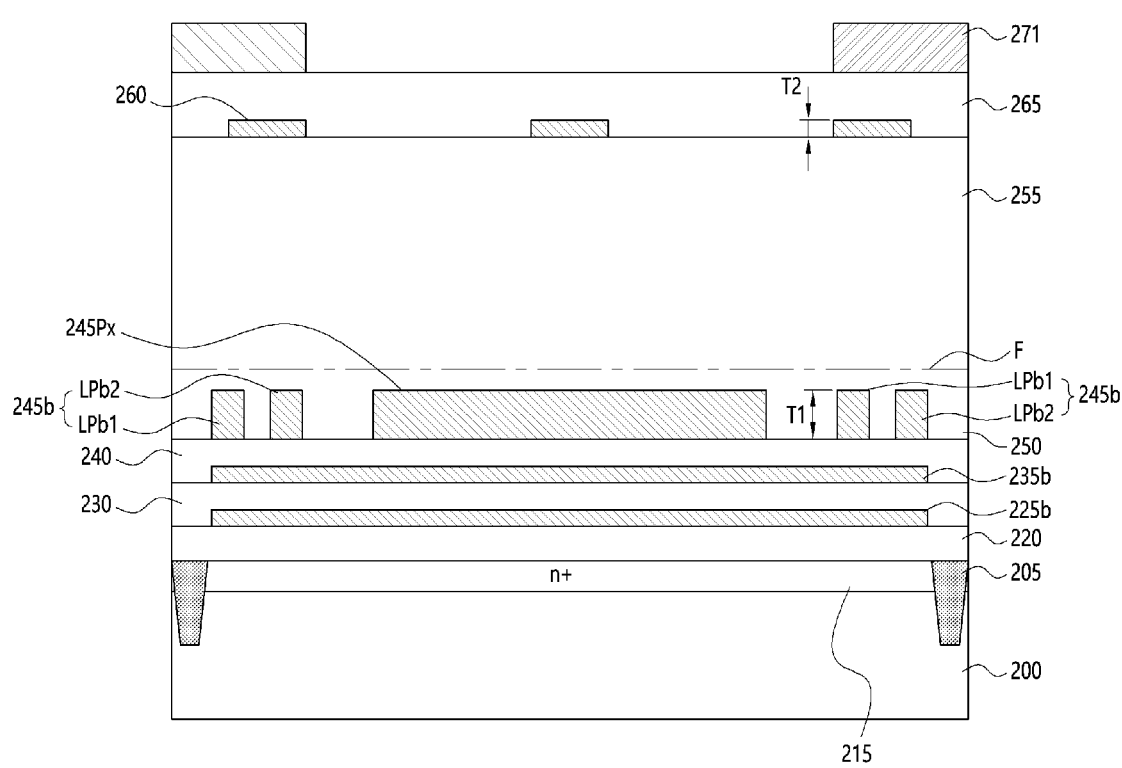
Figure 7A:
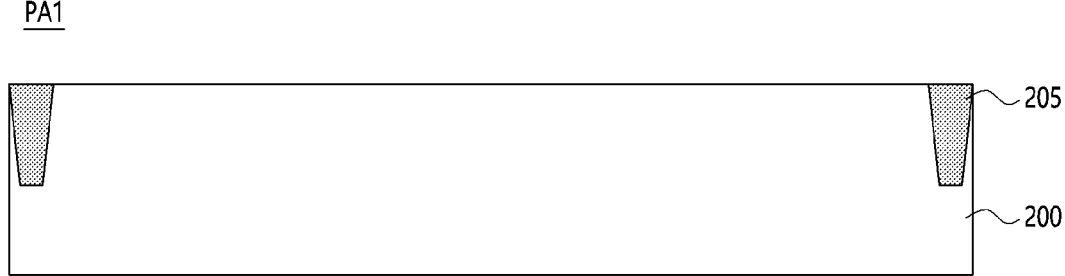
FIGS. 7A to 7F are cross-sectional views taken along a line c-c' in FIGS. 4A to 4F.
Figure 7B:
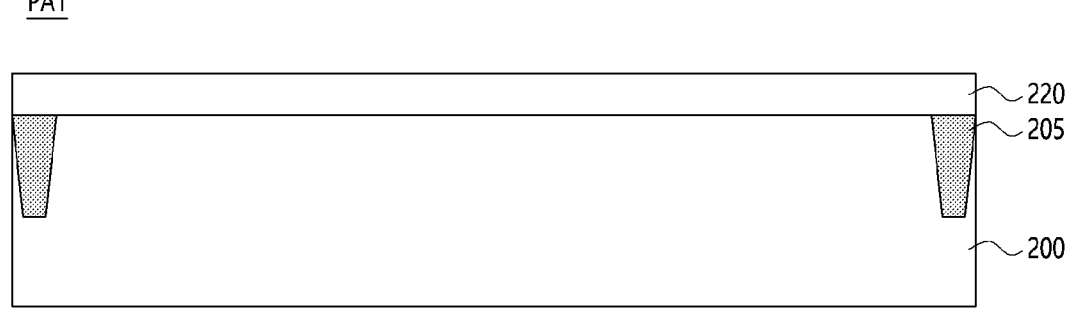
Figures 7C, 7D:
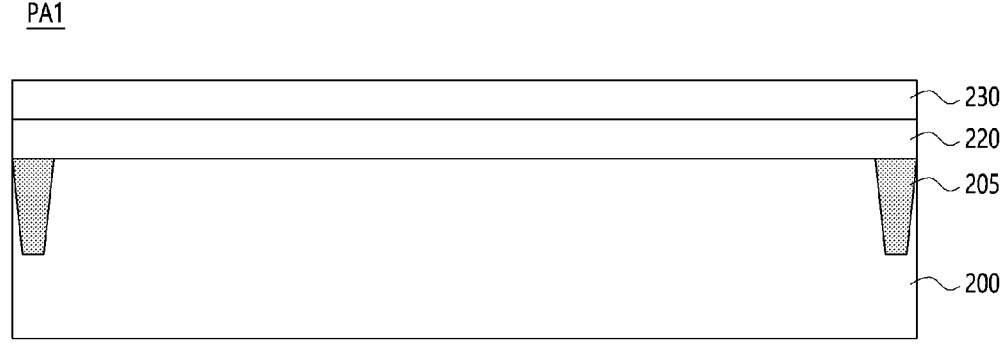
Figure 7E:
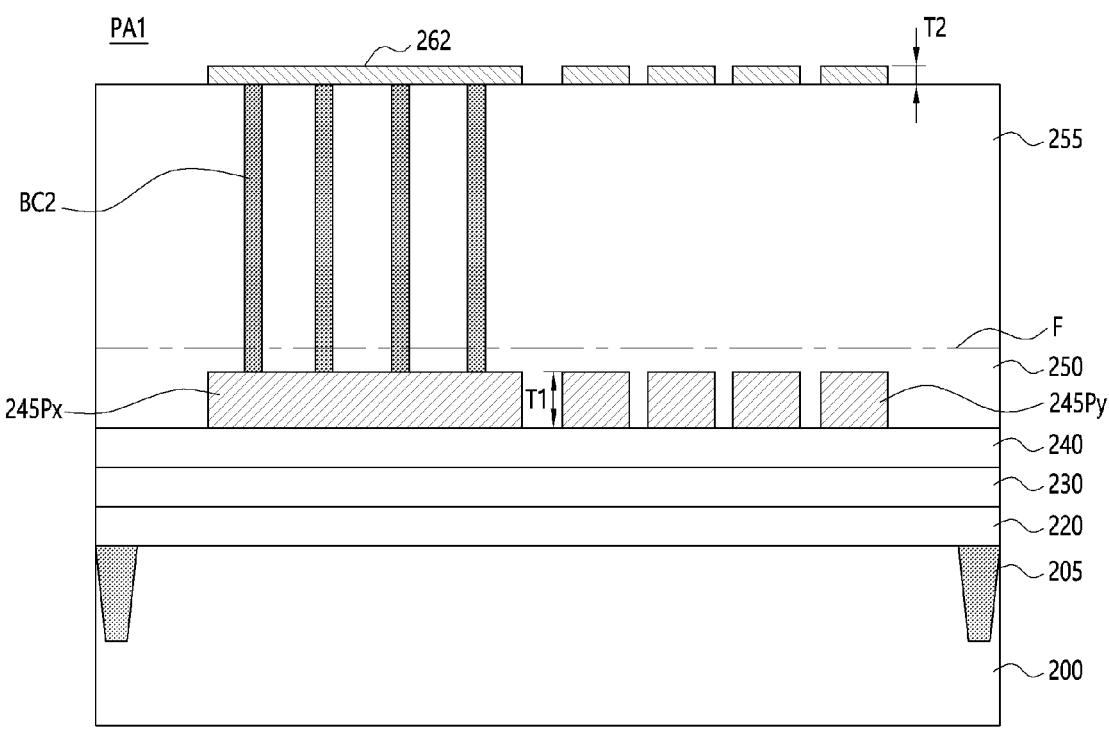
Figure 7F:
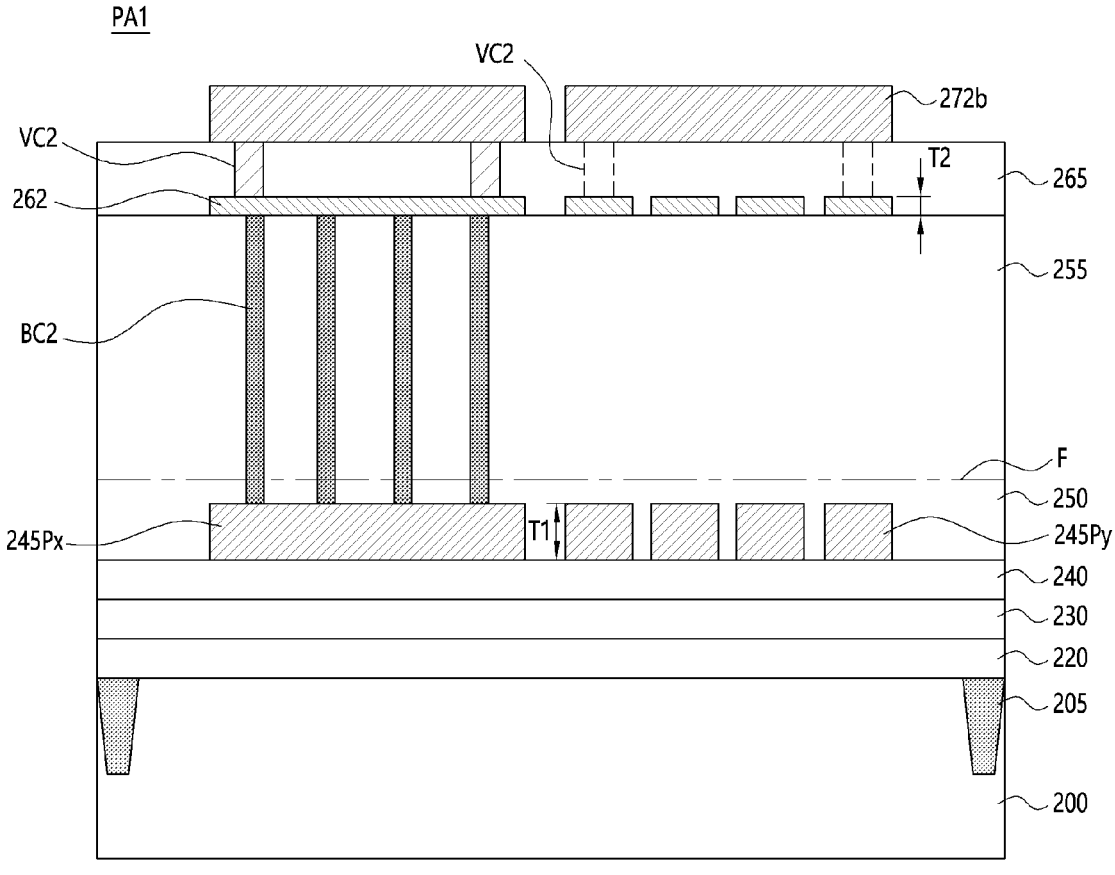

Further, as shown in FIG. 4D, because the ESD connection unit 245P having the width wider than the width of the anode region 210 and having a mesh shape, current I generated by the voltage of the static electricity, which may flow from the anode region 245a to the ESD connection unit 245P, may effectively diffuse in the ESD connection unit 245P to effectively disperse the static electricity.

Furthermore, the third lower electrode wiring 245b and the first upper electrode wiring 260, which may be electrically connected to the cathode region 215, may have a line pattern substantially parallel to the anode region 210 and spaced apart from the ESD connection unit 245P. Thus, an overlap area between the conductive wiring electrically connected with the cathode region 215 and the conductive wiring electrically connected with the anode region 210 may be reduced to decrease the parasitic capacitance.

Figure 8:
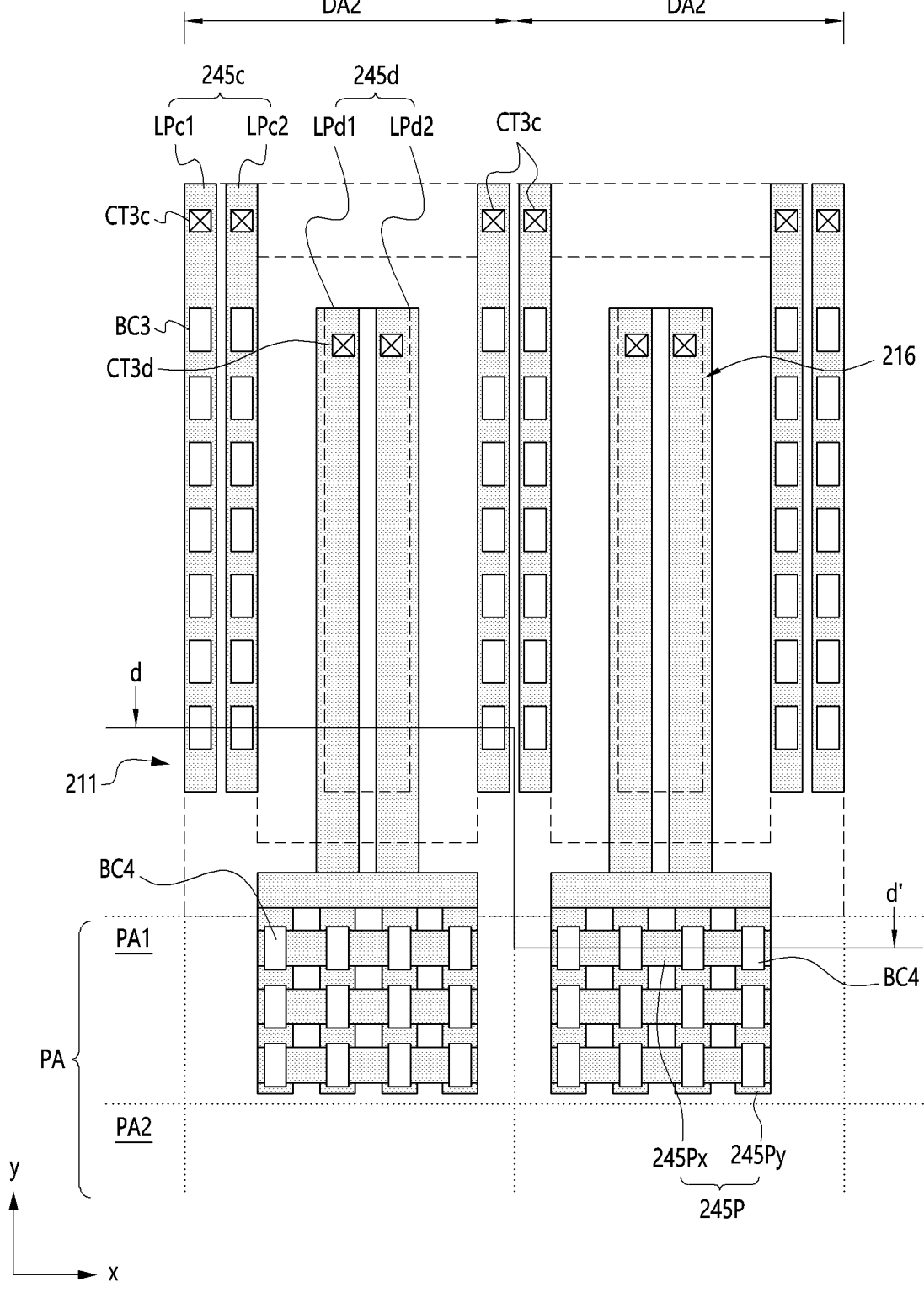
FIG. 8 is a plan view illustrating a second diode and a pad connection of a second protecting unit in accordance with embodiments of the present disclosure.
Figure 9:
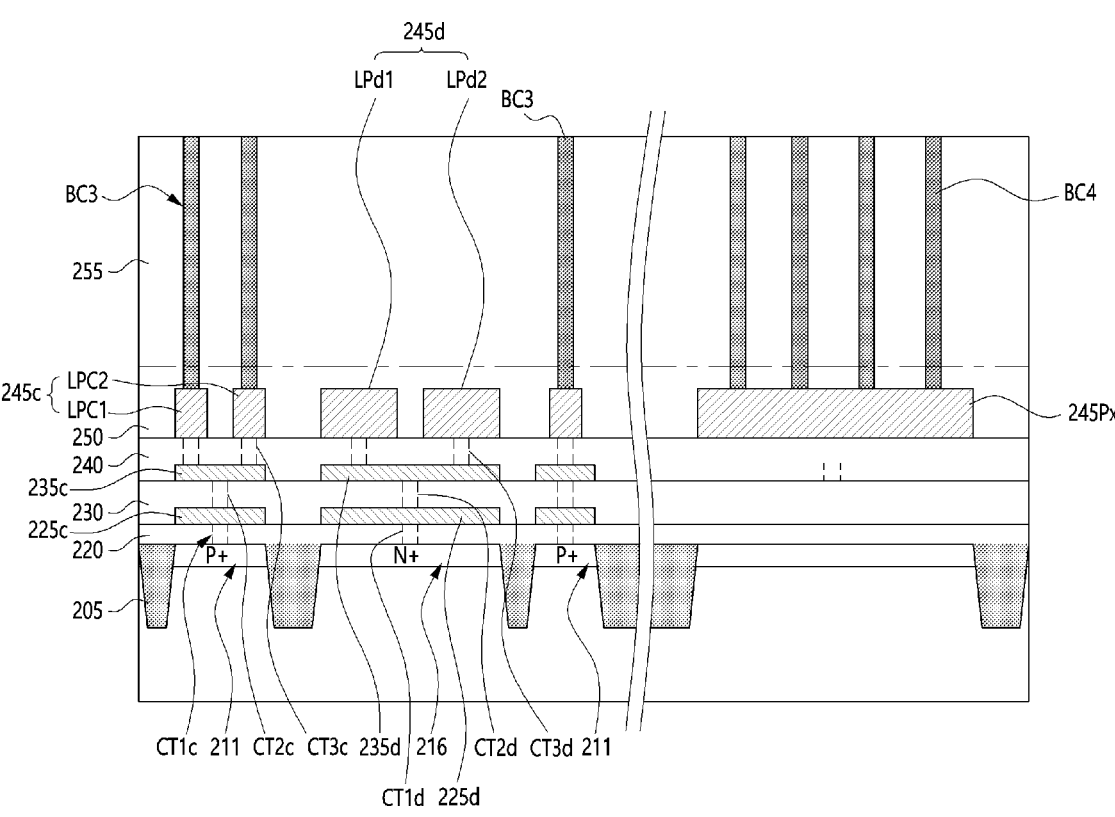
FIG. 9 is a cross-sectional view taken along a line d-d' in FIG. 8.

FIG. 8 is a plan view illustrating a second diode and a pad connection of a second protecting unit in accordance with embodiments of the present disclosure, and FIG. 9 is a cross-sectional view taken along a line d-d' in FIG. 8. FIGS. 8 and 9 show a process for forming a buried contact that more completely depicts a structure of a second diode D2.

Referring to FIGS. 8 and 9, similar to the first diode D1, the second diode D2 may include a quadrangular frame-shaped active region and a bar pattern-shaped active region in the quadrangular frame-shaped active region. In contrast to the first diode D1, an anode region 211 of the second diode D2 may be formed by implanting first conductive type impurities, for example, P type impurities into the frame-shaped active region. A cathode region 216 of the second diode D2 may be formed by implanting second conductive type impurities, for example, N type impurities into the bar pattern-shaped active region. That is, the anode region 211 of the second diode D2 may have a structure substantially the same as the structure of the cathode region 215 of the first diode D1. The cathode region 216 of the second diode D2 may have a structure substantially the same as the structure of the anode region 210 of the first diode D1. A first contact CT1c and CT1d, a first lower conductive wiring 225c and 225d, a second contact CT2c and CT2d, a second lower conductive wiring 235c and 235d and a third contact CT3c and CT3d may be sequentially arranged at regions corresponding to the anode region 211 and the cathode region 216, similar to the first diode D1. A second diode region DA2, in which the second diode D2 may be formed, may be the same as or different from the first diode region DA1 depending on its electrical characteristics.

A third lower conductive wiring 245c (hereinafter, referred to as an anode facing unit) on the anode region 211 may include a first and second line pattern LPc1 and LPc2, similar to the third lower conductive wiring 245b of the first diode region DA1. A third lower conductive wiring 245d (hereinafter, referred to as a cathode facing unit) on the cathode region 216 may include a first and second line pattern LPd1 and LPd2, similar to the third lower conductive wiring 245a of the first diode region DA1.

An ESD connection unit 245P may be formed at the pad connection region PA1 simultaneously with the formation of the third lower conductive wiring 245c and 245d. The ESD connection unit 245P corresponding to the second diode region DA2 may have a structure substantially the same as the structure of the ESD connection unit 245P corresponding to the first diode region DA1. However, the ESD connection unit 245P corresponding to the second diode DA2 may be electrically connected to the cathode region 216 of the second diode DA2.

That is, the first diode D1 and the second diode D2 may have substantially the similar shapes, however, the positions of the anode region and the cathode region may be changed from a circuit-based point of view. Processes for forming the buried contacts BC3 and BC4 and following processes may be substantially the same as the processes used in forming the first diode D1.

In some embodiments, FIGS. 3 to 7F may depict a first protecting unit 150a and a second protecting unit 150b including fixed numbers of the diodes. However, the numbers of the diodes configured to discharge static electricity in the first protecting unit 150a and the second protecting unit 150b may vary in other embodiments.

Figure 10A:
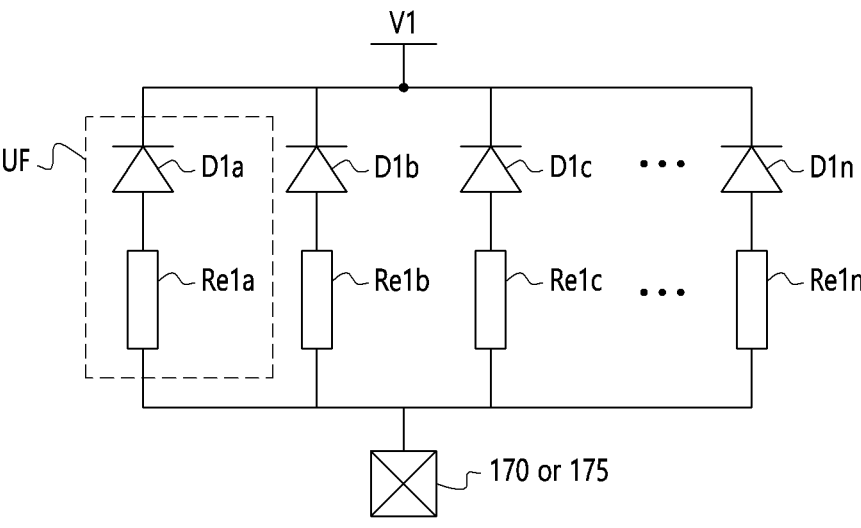
FIGS. 10A and 10B are circuit diagrams illustrating an ESD protection circuit with a revision unit in accordance with embodiments of the present disclosure.
Figure 10B:
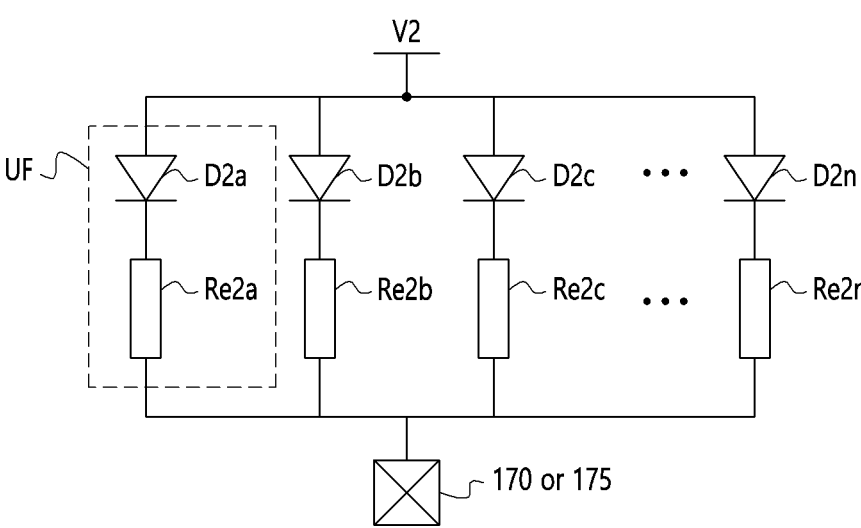
Figure 11:
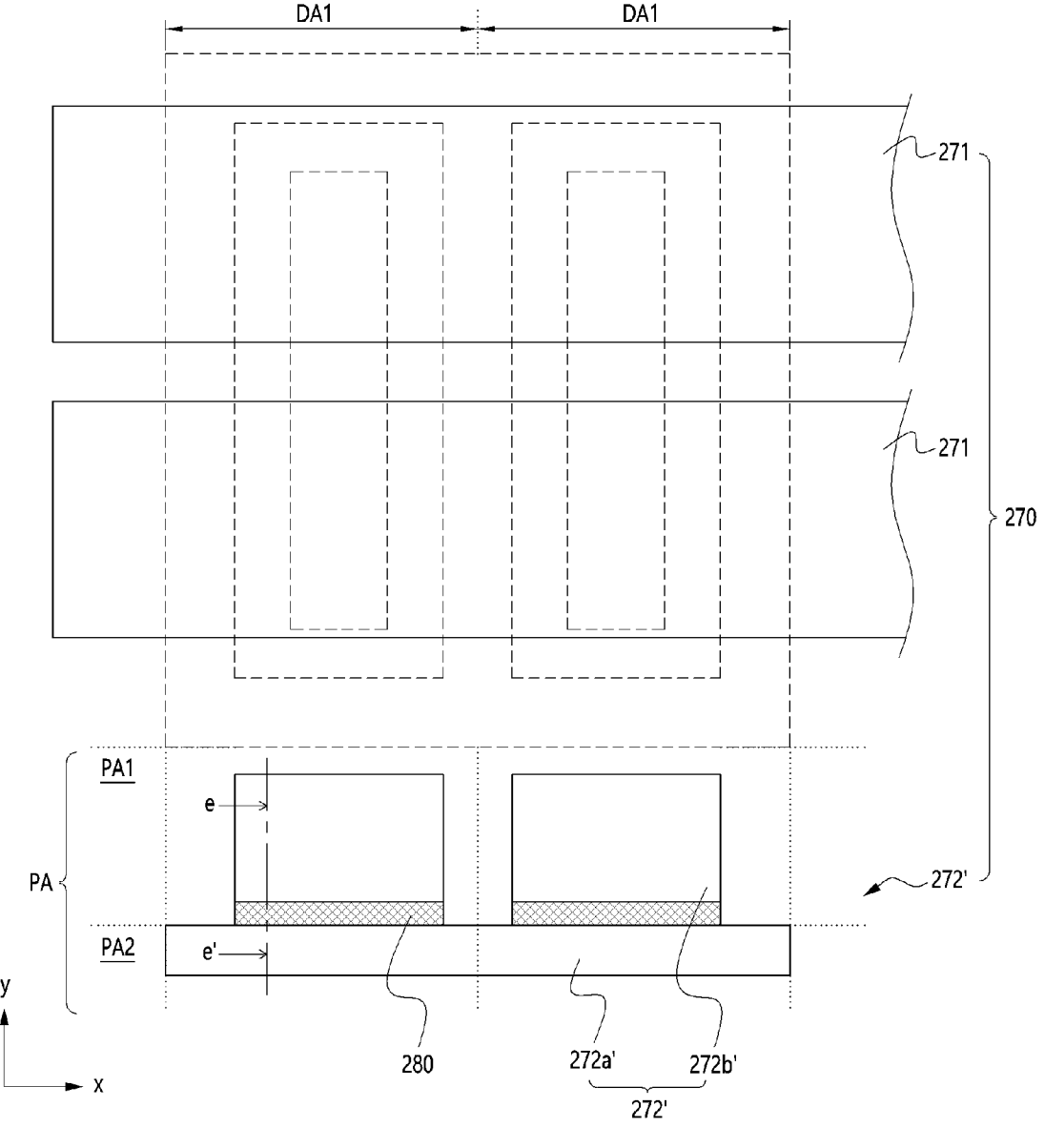
FIG. 11 is a plan view illustrating a first protecting unit and a pad connection in FIG. 10A.
Figure 12:
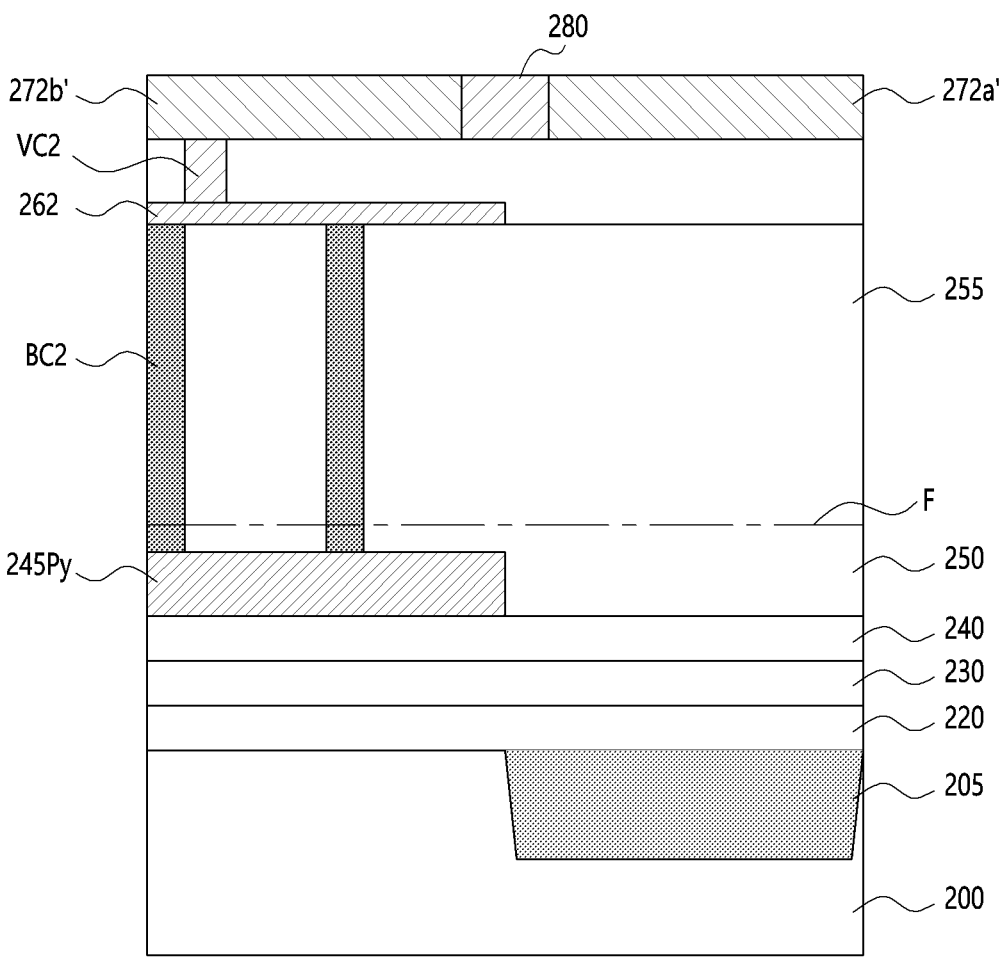
FIG. 12 is a cross-sectional view taken along a line e-e' in FIG. 11.
Figure 13:
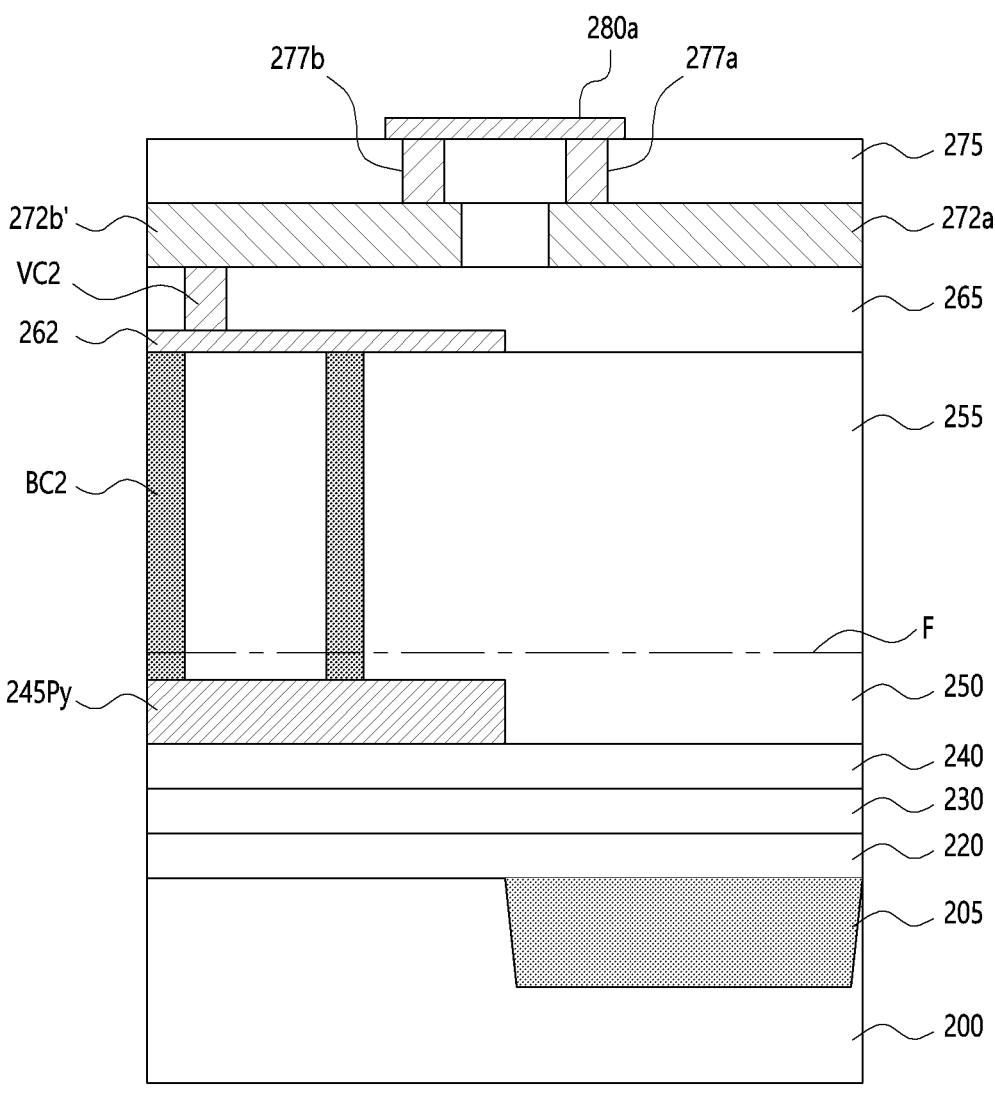
FIG. 13 is a cross-sectional view taken along a line e-e' in FIG. 11 in accordance with example embodiments.

FIGS. 10A and 10B are circuit diagrams illustrating an ESD protection circuit with a revision unit in accordance with embodiments of the present disclosure. FIG. 11 is a plan view illustrating a first protecting unit and a pad connection in FIG. 10A. FIG. 12 is a cross-sectional view taken along a line e-e' in FIG. 11, and FIG. 13 is a cross-sectional view taken along a line e-e' in FIG. 11 in accordance with example embodiments.

Referring to FIG. 10A, a first protecting unit 150a of an ESD protection circuit 150 may include a plurality of first diodes D1a~D1n and a plurality of revisions Re1a~Re1n.

Cathodes of the first diodes D1a~D1n may be connected in common to the first power line V1. A first end of each of the revisions Re1a~Re1n may be connected respectively to anodes of the first diodes D1a~D1n. A second end of each of the revisions Re1a~Re1n may be connected to the bonding pad 170 or connection pad 175.

That is, each of first diodes D1a~D1n and each of the revisions Re1a~Re1n may be connected in series respectively with each other. In some embodiments, one diode and one revision that are connected in series may be referred to as a unit finger UF. A plurality of unit fingers UF may be connected in parallel between the first power line V1 and the bonding pad 170 or connection pad 175.

Referring to FIG. 10B, a second protecting unit 150b of the ESD protection circuit 150 may include a plurality of second diodes D2a~D2n and a plurality of revisions Re2a~Re2n.

Anodes of the second diodes D2a~D2n may be connected in common to the second power line V2. One end of each of the revisions Re2a~Re2n may be connected respectively to cathodes of the second diodes D2a~D2n. The other end of each of the revisions Re2a~Re2n may be connected in common to the bonding pad 170 or connection pad 175.

Each of second diodes D2a~D2n and each of the revisions Re2a~Re2n may be connected in series respectively with each other to form unit fingers UF. A plurality of unit fingers UF may be connected in parallel between the second power line V2 and the bonding pad 170 or connection pad 175.

Each of the revisions Re1a~Re1n and Re2a~Re2n may include a conductive layer. The revisions Re1a~Re1n and Re2a~Re2n may be selectively cut by a laser blowing process similar to a fuse. The diodes D1a~D1n and D2a~D2n connected to cut revisions Re1a"Re1n and Re2a~Re2n may be floated so that they do not function to discharge the static electricity in the first and second protecting units 150a and 150b. Thus, the numbers of the diodes, which may be configured to discharge the static electricity, in the first and second protecting units 150a and 150b may be controlled or determined by selectively cutting the revisions Re1a~Re1n and Re2a~Re2n.

Referring to FIG. 11, the revisions Re1a~Re1n and Re2a~Re2n may include a conductive revision layer 280 between the pad 272a' and the pad connection portion 272b'. The conductive revision layer 280 may include a metal that is the same as, or different from, the metal of the pad 272a' and the pad connection portion 272b'.

The pad 272a' and the pad connection portion 272b' may be spaced apart from each other to electrically isolate the pad 272a' from the pad connection portion 272b'. The conductive revision layer 280 may be arranged between the pad 272a' and the pad connection portion 272b' to electrically connect the pad 272a' with the pad connection portion 272b'.

Referring to FIG. 12, the conductive revision layer 280 may be formed in a space between the pad 272a' and the pad connection portion 272b'. The conductive revision layer 280 may include sidewalls configured to contact the pad 272a' and the pad connection portion 272b' in order to electrically connect the pad 272a' with the pad connection portion 272b'. For example, the conductive revision layer 280 may have a thickness substantially equal to or less than the thickness of the pad 272a' and the pad connection portion 272b'.

Referring to FIG. 13, in some embodiments, a conductive revision layer 280a may be arranged on the pad 272a' and the pad connection portion 272b'. For example, a sixth insulating interlayer 275 may be formed on the fifth insulating interlayer 265, which includes the pad 272a' and the pad connection portion 272b'. The sixth insulating interlayer 275 may be etched to form second via holes that are configured to expose upper surfaces of the pad 272a' and the pad connection portion 272b'. The second via holes may be formed at adjacent edges in the pad 272a' and the pad connection portion 272b', respectively.

The second via holes may then be filled with a conductive material to form second via contacts 277a and 277b. The conductive revision layer 280a may be formed on the sixth insulating interlayer 275 to electrically connect the second via contact 277a on the pad 272a' with the second via contact 277b on the pad connection portion 272b'.

As mentioned above, the numbers of the diodes operated as the first and second protecting units may vary depending on the number and characteristics of the revision structures.

In some embodiments, the first and second protecting units include the diodes, but embodiments of the disclosure are not limited to diodes. In other embodiments, the first and second protecting units may include an SCR diode, an OTS diode, ESD elements, and the like.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor integrated circuit device comprising:
a first region, arranged adjacent to a semiconductor substrate, that includes an electrostatic discharge (ESD) protection circuit;
a second region, stacked on the first region in a vertical direction, that includes a plurality of memory cells;
a pad structure, arranged over the second region, that receives an external voltage; and
an ESD connection configured to connect the ESD protection circuit and the pad structure,
wherein, in a plan view, a portion of the ESD connection facing the pad structure is configured in a mesh shape.

2. The semiconductor integrated circuit device of claim 1, wherein the ESD connection comprises:
a first lower conductive wiring disposed over the ESD protection circuit;
a second lower conductive wiring disposed over the first lower conductive wiring; and
a third lower conductive wiring extending toward the pad structure to face the pad structure and electrically connecting to the second lower conductive wiring, and
wherein the first to third lower conductive wirings are sequentially stacked on the ESD protection circuit.

3. The semiconductor integrated circuit device of claim 2, wherein the ESD protection circuit comprises a diode region including an anode region and a cathode region, and
wherein at least one of the anode region and the cathode region is electrically connected to the ESD connection.

4. The semiconductor integrated circuit device of claim 2, wherein the third lower conductive wiring facing to the pad structure has the mesh shape, and the third lower conductive wiring having the mesh shape comprises a plurality of perpendicular patterns that intersect with a plurality of horizontal patterns that are coplanar.

5. The semiconductor integrated circuit device of claim 1, wherein the pad structure comprises a pad and at least one upper conductive wiring connecting the pad and the ESD connection.

6. The semiconductor integrated circuit device of claim 5, further comprising a revision disposed between the pad and the upper conductive wiring to selectively connect or disconnect the pad with or from the upper conductive wiring.

7. The semiconductor integrated circuit device of claim 5, further comprising a plurality of power lines coplanar with the pad structure and arranged over the ESD protection circuit.

8. The semiconductor integrated circuit device of claim 5, wherein the second region further comprises a plurality of source lines, a plurality of word lines and a plurality of bit lines connected to the plurality of memory cells,
wherein the at least one upper conductive wiring includes a first upper conductive wiring disposed coplanar with the bit lines, and
wherein the ESD connection has a thickness greater than thicknesses of the bit lines and the first upper conductive wiring.

9. The semiconductor integrated circuit device of claim 1, further comprising a buried contact extending through the second region and partially through the first region.

10. A semiconductor integrated circuit device:
a cell region including a plurality of memory cells, upper conductive wirings electrically connected with the memory cells, a pad structure configured to receive an external signal and disposed over the cell region, and at least one power line configured to transmit a voltage;
a peripheral circuit region disposed under the cell region, the peripheral circuit region including an ESD protection circuit arranged between the cell region and a semiconductor substrate to discharge a static electricity inputted through the pad structure,
wherein the ESD protection circuit comprises:
a plurality of protection element regions including a first electrode region and a second electrode region isolated from the first electrode region;
at least one lower conductive wiring electrically connected to the first electrode region and the second electrode region; and
an uppermost lower conductive wiring arranged on the least one lower conductive wiring, the uppermost lower conductive wiring including a first electrode correspondence corresponding to the first electrode region, a second electrode correspondence corresponding to the second electrode region, and an ESD connection arranged therebetween and configured to electrically connect the lower conductive wiring to the pad structure.

11. The semiconductor integrated circuit device of claim 10, wherein the first electrode region comprises a cathode region electrically connected to the least one power line and the second electrode region comprises an anode region electrically connected to the pad structure when a driving voltage is applied to the least one power line, and
the first electrode region comprises an anode region electrically connected to the least one power line and the second electrode region comprises a cathode region electrically connected to the pad structure when a ground voltage is applied to the least one power line.

12. The semiconductor integrated circuit device of claim 10, wherein the uppermost lower conductive wiring has a thickness greater than thicknesses of the upper conductive wirings, and the first electrode region has a frame-shape and the second electrode region has a patterned shape.

13. The semiconductor integrated circuit device of claim 10, wherein the uppermost lower conductive wiring facing the pad structure has a mesh shape including coplanar horizontal patterns and vertical patterns.

14. The semiconductor integrated circuit device of claim 10, wherein the first electrode correspondence is positioned over the first electrode region parallel to the second electrode region and the first electrode correspondence is spaced apart from the ESD connection.

15. The semiconductor integrated circuit device of claim 10, wherein the upper conductive wirings comprise:

a bit line electrically connected to the memory cells;

an electrode wiring arranged to correspond to the first electrode correspondence; and a connection wiring arranged to correspond to the ESD connection.

16. The semiconductor integrated circuit device of claim 15, wherein the cell region further comprises:

a buried insulation layer disposed on the memory cells, the buried insulation layer having a total thickness greater than a height of the memory cells; and a buried contact configured to electrically connect the first electrode correspondence with the electrode wiring and to electrically connect the ESD connection with the connection wiring.

17. The semiconductor integrated circuit device of claim 15, wherein the pad structure is arranged on the cell region with the upper conductive wirings, and the pad structure comprises a pad configured to receive the external signal and a pad connection arranged adjacent to the pad to overlap with the connection wiring and to electrically connect to the connection wiring.

18. The semiconductor integrated circuit device of claim 17, further comprising a revision configured to selectively connect the pad with the pad connection.

19. The semiconductor integrated circuit device of claim 10, wherein the plurality of protection element regions and the pad structure are electrically connected through the at least one lower conductive wiring, the uppermost lower conductive wring and the upper conductive wirings.

* * * * *